(12) United States Patent
Lee et al.

(10) Patent No.: US 11,868,626 B2
(45) Date of Patent: *Jan. 9, 2024

(54) STORAGE DEVICE SET INCLUDING STORAGE DEVICE AND RECONFIGURABLE LOGIC CHIP, AND STORAGE SYSTEM INCLUDING THE STORAGE DEVICE SET

(71) Applicant: SAMSUNG ELECTRONICS CO., LTD., Suwon-si (KR)

(72) Inventors: Yongin Lee, Suwon-si (KR); Doogie Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/939,393

(22) Filed: Sep. 7, 2022

(65) Prior Publication Data

US 2022/0413722 A1 Dec. 29, 2022

Related U.S. Application Data

(63) Continuation of application No. 16/941,070, filed on Jul. 28, 2020, now Pat. No. 11,474,714.

(30) Foreign Application Priority Data

Dec. 9, 2019 (KR) .................. 10-2019-0162880

(51) Int. Cl.
*G06F 3/08* (2006.01)
*H03M 13/00* (2006.01)
(Continued)

(52) U.S. Cl.
CPC .......... *G06F 3/0629* (2013.01); *G06F 3/0604* (2013.01); *G06F 3/0658* (2013.01);
(Continued)

(58) Field of Classification Search
CPC .... G06F 3/0629; G06F 3/0604; G06F 3/0658; G06F 3/0659; G06F 3/0673; G06F 13/1689
See application file for complete search history.

(56) References Cited

U.S. PATENT DOCUMENTS 9,244,842 B2  1/2016  Borchers et al.
9,461,904 B2  10/2016 Tomlin
(Continued)

OTHER PUBLICATIONS

A research article titled "HMB in DRAM-less NVMe SSDs: Their usage and effects on performance" byKim Kyusik and Kim Taeseok. (Year: 2020).*

(Continued)

*Primary Examiner* — Michael Krofcheck
*Assistant Examiner* — Janice M. Girouard
(74) *Attorney, Agent, or Firm* — Sughrue Mion, PLLC

(57) ABSTRACT

A storage device set is provided. The storage device set includes a reconfigurable logic chip and a storage device. The logic chip includes a retimer configured to generate an output signal by adjusting an input signal received from an external device; and an operation circuit configured to perform an operation function. The storage device includes: a first port connected to the retimer; a second port connected to the operation circuit; and a controller configured to control data transmission and reception via the first port and the second port.

20 Claims, 16 Drawing Sheets

(51) Int. Cl.
  *G06F 3/06* (2006.01)
  *G06F 13/16* (2006.01)
  *G11C 16/10* (2006.01)

(52) U.S. Cl.
  CPC .......... *G06F 3/0659* (2013.01); *G06F 3/0673* (2013.01); *G06F 13/1689* (2013.01); *G06F 3/08* (2013.01); *G09G 2360/125* (2013.01); *G09G 2360/126* (2013.01); *G11C 16/10* (2013.01); *H03M 13/6563* (2013.01)

(56) References Cited

U.S. PATENT DOCUMENTS

| | | |
|---|---|---|
| 9,658,977 B2 | 5/2017 | Trout et al. |
| 9,727,510 B2 | 8/2017 | Edvenson et al. |
| 9,852,779 B2 | 12/2017 | Lee |
| 10,037,152 B2 | 7/2018 | Li |
| 10,223,313 B2 | 3/2019 | Shih |
| 2016/0364346 A1 | 12/2016 | Yang et al. |
| 2017/0017604 A1 | 1/2017 | Chen et al. |
| 2018/0285227 A1* | 10/2018 | Sharma ................ H04L 69/323 |
| 2019/0155777 A1 | 5/2019 | Shim |
| 2019/0258600 A1 | 8/2019 | Das Sharma |
| 2020/0004703 A1 | 1/2020 | Sankaran et al. |
| 2021/0313993 A1* | 10/2021 | Bai ........................ H04L 7/005 |

OTHER PUBLICATIONS

The JEDEC Standard—Universal Falsh Storage (UFS) Unified Memory Extension Version 1.0. (Year: 2012).*
A presentation titled UFS Unified Memory Extension by Masfumi Takahashi (Year: 2014).*

* cited by examiner

STORAGE DEVICE SET INCLUDING STORAGE DEVICE AND RECONFIGURABLE LOGIC CHIP, AND STORAGE SYSTEM INCLUDING THE STORAGE DEVICE SET

CROSS-REFERENCE TO THE RELATED APPLICATION

This a continuation of U.S. application Ser. No. 16/941,070 filed Jul. 28, 2020, issued as U.S. Pat. No. 11,474,714 on Oct. 18, 2022, which claims priority from Korean Patent Application No. 10-2019-0162880, filed on Dec. 9, 2019, in the Korean Intellectual Property Office, the disclosures of which are incorporated by reference herein in their entireties.

BACKGROUND

Methods and apparatuses consistent with example embodiments to a storage device, and more particularly, to a storage device set including a storage device and a reconfigurable logic chip, a storage system including the storage device set, and an operating method of the storage device.

To improve a processing speed of a storage system, an accelerator assisting operations of a host by performing some of operations performed by the host may be added to the storage system. The accelerator may be a dedicated hardware accelerator performing set functions or an accelerator reconfigurable according to a design file, such as a field programmable gate array (FPGA) image. Recently, because the host performs various applications and requires high-speed processing for each application, the need for a reconfigurable accelerator, such as a FPGA reconfigurable according to various applications, is increasing.

SUMMARY

Example embodiments provide a storage device set capable of minimizing input and output delay by performing communication with a host by using a retimer, a storage system including the storage device set, and an operating method of the storage device set.

According to an aspect of an example embodiment, there is provided storage device set including: a reconfigurable logic chip including: a retimer configured to generate an output signal by adjusting an input signal received from an external device; and an operation circuit configured to perform an operation function; and a storage device including: a first port connected to the retimer; a second port connected to the operation circuit; and a controller configured to control data transmission and reception via the first port and the second port.

According to an aspect of an example embodiment, there is provided a storage system including: a host; a retimer communicably coupled with the host; a storage device including a controller configured to receive a request from the host via the retimer and generate input data corresponding to the received request; and a reconfigurable logic chip configured to receive the input data from the storage device, generate output data by performing an operation corresponding to the received request by using the input data, and provide the output data to the storage device.

According to an aspect of an example embodiment, there is provided an operating method of a storage device connected to a reconfigurable logic chip that includes a retimer and an operation circuit, the storage device including a first port that is connected to the retimer and a second port that is connected to the operation circuit, the operating method including: receiving a request of a host via the first port; generating input data corresponding to the received request; providing the input data to the operation circuit via the second port; obtaining, from the operation circuit, output data corresponding to the input data via the second port; generating response data corresponding to the received request based on the output data; and transmitting, to the host, the generated response data via the first port and the retimer.

BRIEF DESCRIPTION OF THE DRAWINGS

The above and other aspects, features and advantages will be more clearly understood from the following detailed description taken in conjunction with the accompanying drawings in which.

DETAILED DESCRIPTION

Figure 1:
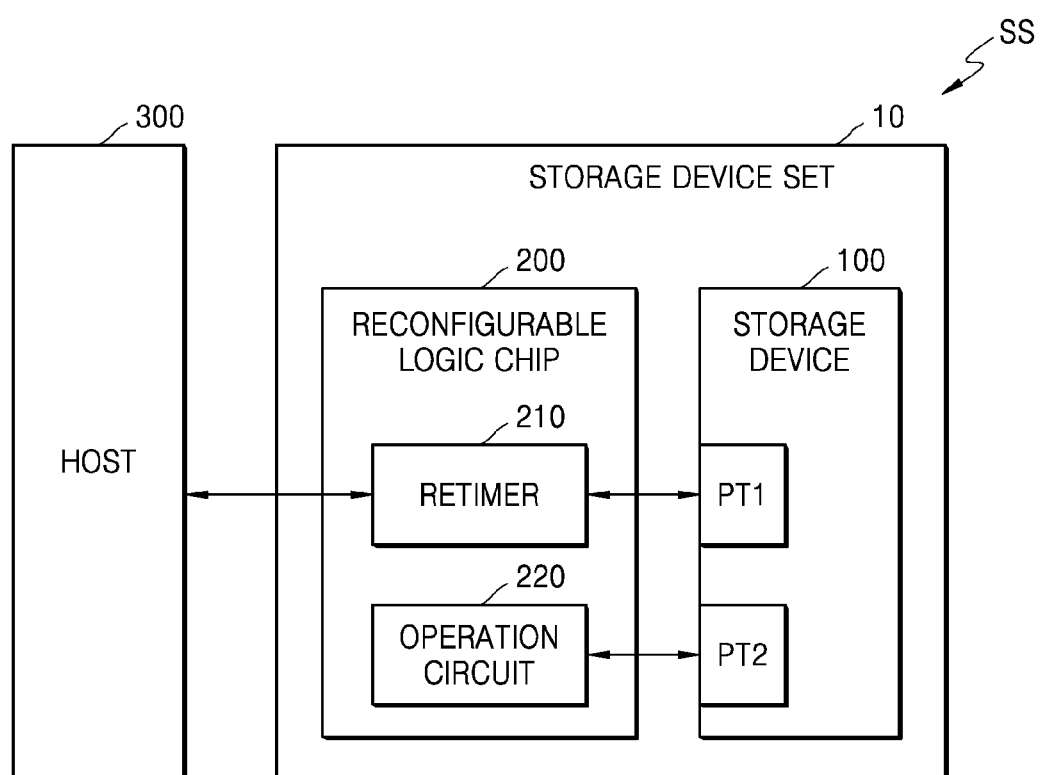
FIG. 1 is a block diagram schematically showing a storage system according to an example embodiment.

FIG. 1 is a block diagram schematically showing a storage system SS according to an example embodiment.

Referring to FIG. 1, the storage system SS includes a storage device set 10 and a host 300. The storage device set 10 may include a storage device 100 and a reconfigurable logic chip 200, and may be referred to as a smart storage device. The storage device 100 may include a first port PT1 and a second port PT2, and accordingly, the storage device 100 may be referred to as a dual port storage device. The reconfigurable logic chip 200 may include a retimer 210 and an operation circuit 220.

The storage system SS may be implemented as, for example, a personal computer (PC), a data server, a network-combined storage, an Internet of things (IoT) device, or a portable electronic device. The portable electronic device may be a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, or a wearable device.

According to some example embodiments, the storage device 100 may be an internal memory embedded in an electronic device. For example, the storage device 100 may be a solid state drive (SSD), an embedded universal flash storage (UFS) memory device, or an embedded multi-media card (eMMC). According to some example embodiments, the storage device 100 may be an external memory detachably attached to an electronic device. For example, the storage device 100 may be a UFS memory card, a compact flash (CF) card, a secure digital (SD) card, a micro-SD card, a mini-SD card, an extreme digital (xD) card, or a memory stick.

According to an example embodiment, the storage device 100 may be embodied as a first chip and the reconfigurable logic chip 200 may be embodied as a second chip. The first chip and the second chip may be electrically connected to each other and mounted on a single board. According to an example embodiment, the storage device 100 may be embodied as a first chip and the reconfigurable logic chip 200 may be embodied as a second chip. The first chip and the second chip may configure a package-on-package (POP). However, example embodiments are not limited thereto, and the storage device set 10 may be configured as the storage device 100 and the reconfigurable logic chip 200 are electrically connected to each other.

According to an example embodiment, the reconfigurable logic chip 200 may include a field programmable gate array (FPGA) chip. However, example embodiments are not limited thereto, and the reconfigurable logic chip 200 may include a programmable logic device (PLD) or a complex PLD (CPLD). The reconfigurable logic chip 200 may be used as an accelerator for assisting an operation of the host 300 by performing some of operations performed by the host 300.

The reconfigurable logic chip 200 may include the retimer 210 that, when a signal is input from an external device, generates an output signal by adjusting the input signal. The retimer 210 may remove jitter of the input signal, repair damage, and transmit the restored input signal by using a local clock signal. According to an example embodiment, the retimer 210 may receive data from the host 300, adjust the received data, and transmit the adjusted data to the storage device 100. Also, the retimer 210 may receive data from the storage device 100, adjust the received data, and transmit the adjusted data to the host 300. The retimer 210 may include a peripheral component interconnect express (PCIe) retimer according to a PCIe protocol. However, example embodiments are not limited thereto, and the retimer 210 may include a retimer according to another protocol.

The retimer 210 may transmit a signal only via a physical layer. Accordingly, by using the retimer 210, the storage device set 10 may increase a data transmission and reception speed with the host 300. In particular, the retimer 210 may transmit a signal only via a physical layer without a transaction layer and a data link layer. On the other hand, in the case of a switch (for example, a PCIe switch) available as an interface transmitting a signal instead of the retimer 210, a signal may be transmitted via all of the transaction layer, the data link layer, and the physical layer. Accordingly, the storage device set 10 may increase an input and output speed of a signal by using the retimer 210 instead of a switch transmitting a signal via a plurality of layers.

It has been described that the storage device set 10 includes the retimer 210, but example embodiments are not limited thereto, and the storage device set 10 may include an interface capable of transmitting a signal, instead of the retimer 210. For example, the storage device set 10 may include a repeater including the retimer 210 and a redriver.

The reconfigurable logic chip 200 may include the operation circuit 220 capable of performing an operation function. According to an example embodiment, the operation circuit 220 may receive input data from the storage device 100, perform an operation on the input data, and transmit output data generated as a result to the storage device 100. For example, the operation circuit 220 may perform various operations by using the input data, such as encryption, decryption, compression, decompression, pattern matching, sorting, and searching. Moreover, the operations performable by the operation circuit 220 are not limited to the above. According to an example embodiment, the operation circuit 220 may perform an operation according to a pre-determined configuration. The reconfigurable logic chip 200 may be reconfigured during operation, and accordingly, the operation circuit 220 may be changed to a second operation circuit while operating as a first operation circuit.

The storage device 100 may communicate with the host 300 via the first port PT1. In particular, the storage device 100 may be connected to the retimer 210 via the first port PT1. Also, the storage device 100 may communicate with the host 300 according to a first interface protocol via the first port PT1 and the retimer 210. For example, the first interface protocol may be PCIe. However, example embodiments are not limited thereto, and the first interface protocol may be universal serial bus (USB), PCI, advanced technology (AT) attachment (ATA), serial AT attachment (SATA), parallel AT attachment (PATA), small computer system interface (SCSI), serial attached SCSI (SAS), enhanced small disk interface (ESDI), or integrated drive electronics (IDE).

The storage device 100 may communicate with the operation circuit 220 of the reconfigurable logic chip 200 via the second port PT2. In particular, the storage device 100 may be connected to the operation circuit 220 via the second port PT2. Also, the storage device 100 may communicate with the operation circuit 220 according to a second interface protocol via the second port PT2. According to an example embodiment, the first port PT1 and the second port PT2 of the storage device 100 may be different from each other. In other words, the storage device 100 may transmit and receive data to and from the host 300 via the first port PT1, and transmit and receive data to and from the operation circuit 220 via the second port PT2. Also, the second interface protocol and the first interface protocol may be the same protocol. However, example embodiments are not limited thereto, and the second interface protocol and the first interface protocol may be different from each other.

As such, the storage device 100 may transmit and receive data to and from the host 300 by being connected to the retimer 210 of the reconfigurable logic chip 200 via the first port PT1, and transmit and receive data to and from the reconfigurable logic chip 200 by being connected to the operation circuit 220 of the reconfigurable logic chip 200 via the second port PT2.

Also, the storage device set 10 according may minimize input and output delay by transmitting and receiving data by using the retimer 210 that performs data transmission and reception via a physical layer, instead of a switch that performs data transmission and reception via a plurality of layers.

Moreover, it is described with respect to FIG. 1 that the storage device set 10 includes the reconfigurable logic chip 200, but example embodiments are not limited thereto, and the storage device set 10 may include a general-purpose operator such as a central processing unit (CPU) or a graphics processing unit (GPU) capable of performing an operation function, instead of the reconfigurable logic chip 200. When the storage device set 10 includes the general-purpose operator, the general-purpose operator may include a retimer connected to the first port PT1 of the storage device 100 and an operation circuit connected to the second port PT2 of the storage device 100.

Figure 2:
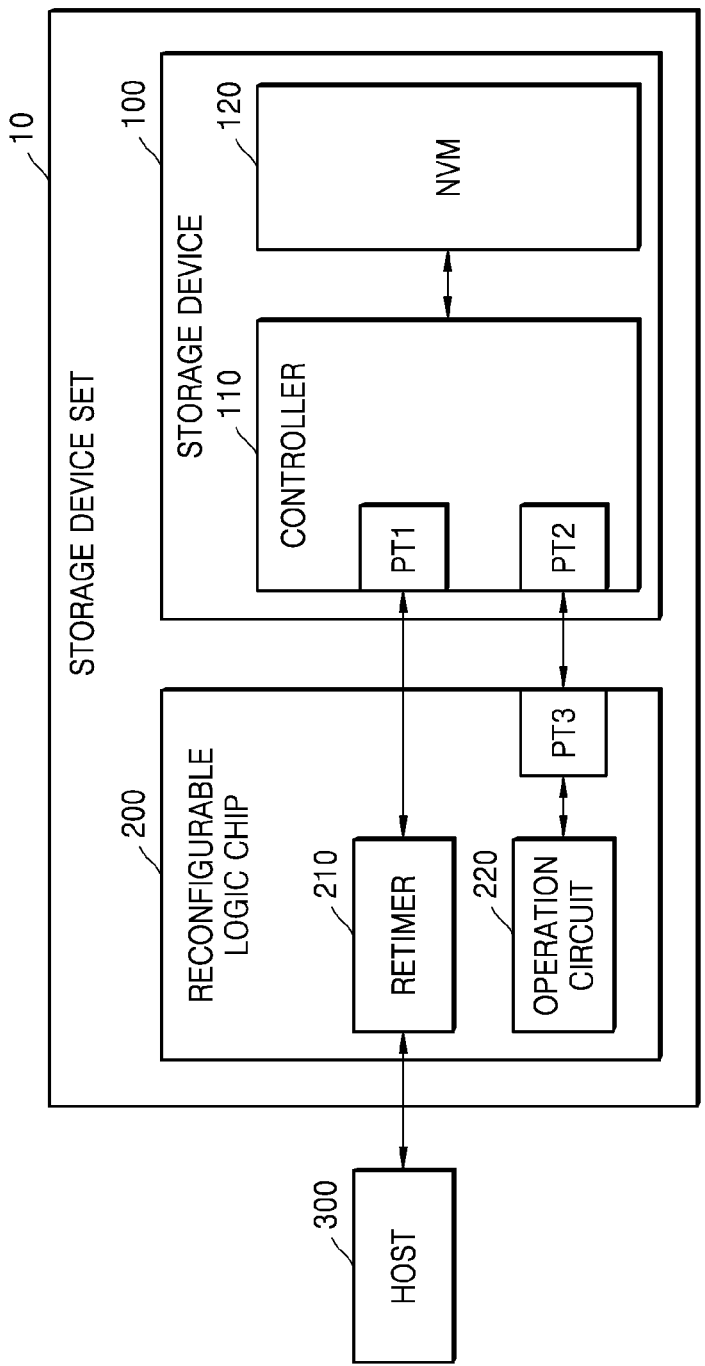
FIG. 2 is a block diagram showing in detail a storage device set according to an example embodiment.

FIG. 2 is a block diagram showing in detail the storage device set 10 according to an example embodiment. In particular, FIG. 2 is a block diagram showing in detail the storage device set 10 of FIG. 1.

Referring to FIG. 2, the storage device set 10 may include the storage device 100 and the reconfigurable logic chip 200. The storage device 100 may include a controller 110 and a non-volatile memory (NVM) 120. According to an example embodiment, the controller 110 and the NVM 120 may be implemented as individual chips. The reconfigurable logic chip 200 may include the retimer 210 and the operation circuit 220.

The host 300 may transmit, to the storage device set 10, a host command requesting a certain operation, such as a write request or a read request. According to an example embodiment, the host 300 may transmit, to the storage device set 10, data related to the host command together with the host command.

The storage device set 10 may receive the host command via the retimer 210 of the reconfigurable logic chip 200. The retimer 210 may adjust the received host command and transmit the adjusted host command to the storage device 100. According to an example embodiment, the retimer 210 may transmit the adjusted host command to the controller 110 including the first port PT1. According to an example embodiment, the retimer 210 may adjust the data related to the received host command and transmit the adjusted data to the controller 110 including the first port PT1.

The storage device 100 may receive the host command and generate a command by analyzing the host command. According to an example embodiment, the controller 110 may analyze the host command received via the retimer 210 and the first port PT1, and generate a command for controlling the operation circuit 220 upon determining that an operation of the operation circuit 220 is required. According to an example embodiment, the controller 110 may include a scheduler for decoding the host command and generating the command as described above.

The controller 110 may generate input data required to perform an operation requested by the host 300. According to an example embodiment, when it is determined that the operation of the operation circuit 220 is required, the controller 110 may generate the input data by using data received from the host 300 or generate the input data by reading data from the NVM 120.

The storage device 100 may provide the generated input data to the operation circuit 220 via the second port PT2. According to an example embodiment, the reconfigurable logic chip 200 may include a third port PT3 connected to the operation circuit 220 and distinguished from the retimer 210, and the storage device set 10 may include a root (for example, a PCIe bus) connecting the second port PT2 and the third port PT3. Also, the controller 110 may transmit the generated input data to the operation circuit 220 via the second port PT2 and the third port PT3. According to an example embodiment, the host 300 may transmit, together with the input data, a command indicating an operation requested by the host 300.

The operation circuit 220 may receive the input data and generate output data by performing an operation corresponding to the operation requested by the host 300, by using the received input data. For example, when the operation circuit 220 receives a command indicating compression, the operation circuit 220 may generate the output data by compressing the input data. Then, the operation circuit 220 may provide the generated output data to the storage device 100 via the second port PT2. According to an example embodiment, the operation circuit 220 may transmit the output data to the controller 110 via the third port PT3 and the second port PT2.

Also, the storage device 100 may receive the output data and generate response data regarding the host command, based on the received output data. According to an example embodiment, the controller 110 may receive the output data via the second port PT2 and generate the response data regarding the host command, based on the received output data. Here, the response data may include information indicating whether the operation corresponding to the host command is completed. According to an example embodiment, the controller 110 may perform an additional operation in response to a request of the host 300. For example, when the request of the host 300 is a write request, the controller 110 may write the output data received from the operation circuit 220 to the NVM 120 and generate response data regarding the write request.

Also, the storage device 100 may transmit the response data to the host 300. According to an example embodiment, the controller 110 may transmit the response data to the retimer 210 via the first port PT1. The retimer 210 may adjust the received response data and transmit the adjusted response data to the host 300.

Figure 3:
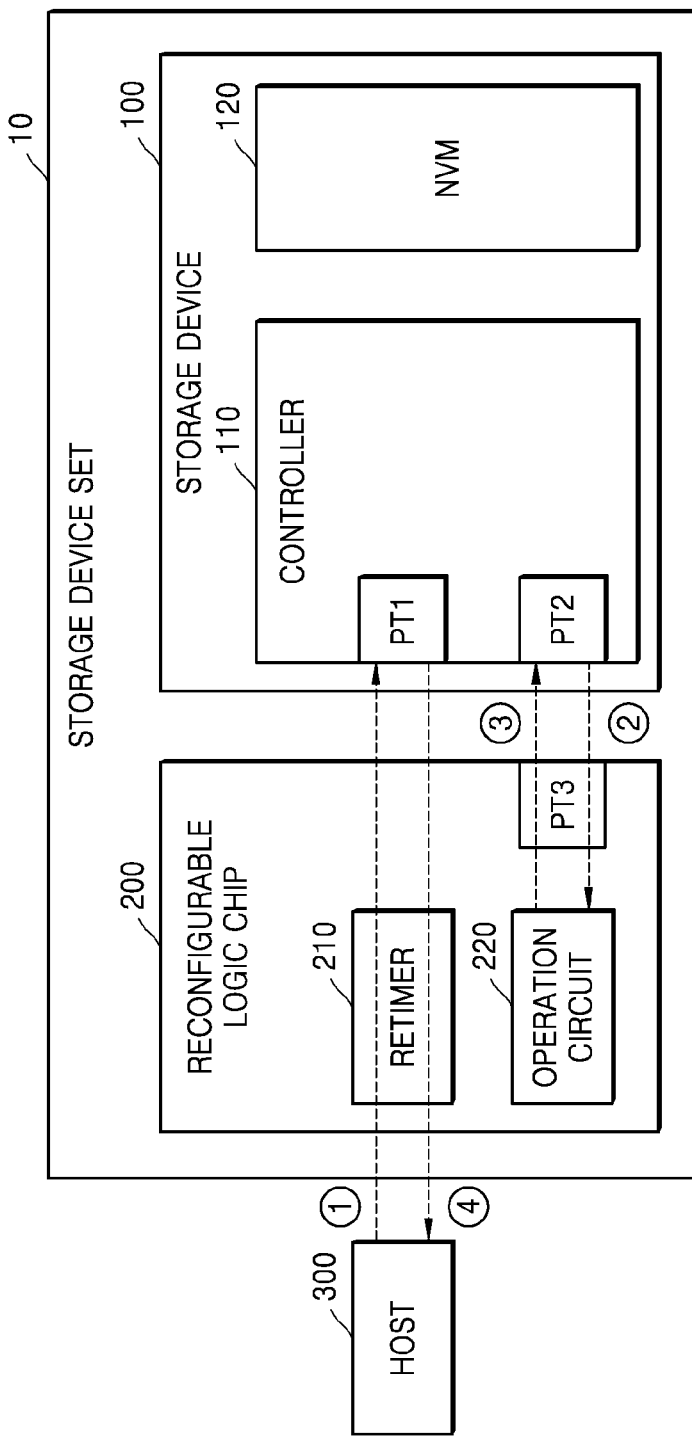
FIG. 3 is a block diagram for describing an operating method of a storage device set, according to an example embodiment.

FIG. 3 is a block diagram for describing an operating method of the storage device set 10, according to an example embodiment. In particular, FIG. 3 is a flow diagram showing an operating method of the storage device set 10 of FIG. 2.

The host 300 and the storage device set 10 may operate based on the same protocol. For example, the host 300 and the storage device set 10 may operate based on a non-volatile memory express (NVMe) protocol. However, example embodiments are not limited thereto, and another protocol may be used. Moreover, for convenience of description, FIG. 3 will be described under an assumption that the host 300 and the storage device set 10 operate based on the NVMe protocol and interfaces respectively included in the host 300 and the storage device set 10 are PCIe devices supporting the NVMe protocol.

Referring to FIGS. 2 and 3, the host 300 may generate a host command to be transmitted to the storage device set 10. According to an example embodiment, the host 300 may include an NVMe driver. The host 300 may generate the host command based on the NVMe protocol by using the NVMe driver.

The host 300 may transmit, to the storage device set 10, the host command generated based on the NVMe protocol. According to an example embodiment, the host 300 may transmit the host command to the retimer 210, and the retimer 210 may adjust the host command and transmit the adjusted host command to the controller 110 via the first port PT1 (operation ①). Then, the controller 110 may generate input data required to perform an operation requested by the host 300, based on the NVMe protocol. According to an example embodiment, the controller 110 may also generate a command indicating the operation requested by the host 300, based on the NVMe protocol.

Then, the controller 110 may transmit the input data to the operation circuit 220 via the second port PT2 (operation ②) According to an example embodiment, the controller 110 may directly transmit the command and the input data to the operation circuit 220 via the second port PT2 and the third port PT3. Then, the operation circuit 220 may receive the command and the input data, and perform an operation corresponding to the received command by using the input data. The operation circuit 220 may generate output data based on the NVMe protocol by performing the operation. In this regard, the operation circuit 220 may include an NVMe driver.

Next, the operation circuit 220 may transmit the output data to the controller 110 via the second port PT2 (operation ③). According to an example embodiment, the operation circuit 220 may directly transmit the output data to the controller 110 via the third port PT3 and the second port PT2. Then, the controller 110 may receive the output data and generate response data regarding the host command, based on the NVMe protocol.

Then, the controller 110 may transmit the response data generated based on the NVMe protocol to the host 300. According to an example embodiment, the controller 110 may transmit the response data to the retimer 210, and the retimer 210 may adjust the response data and transmit the adjusted response data to the host 300 via the first port PT1 (operation ④).

Figure 4:
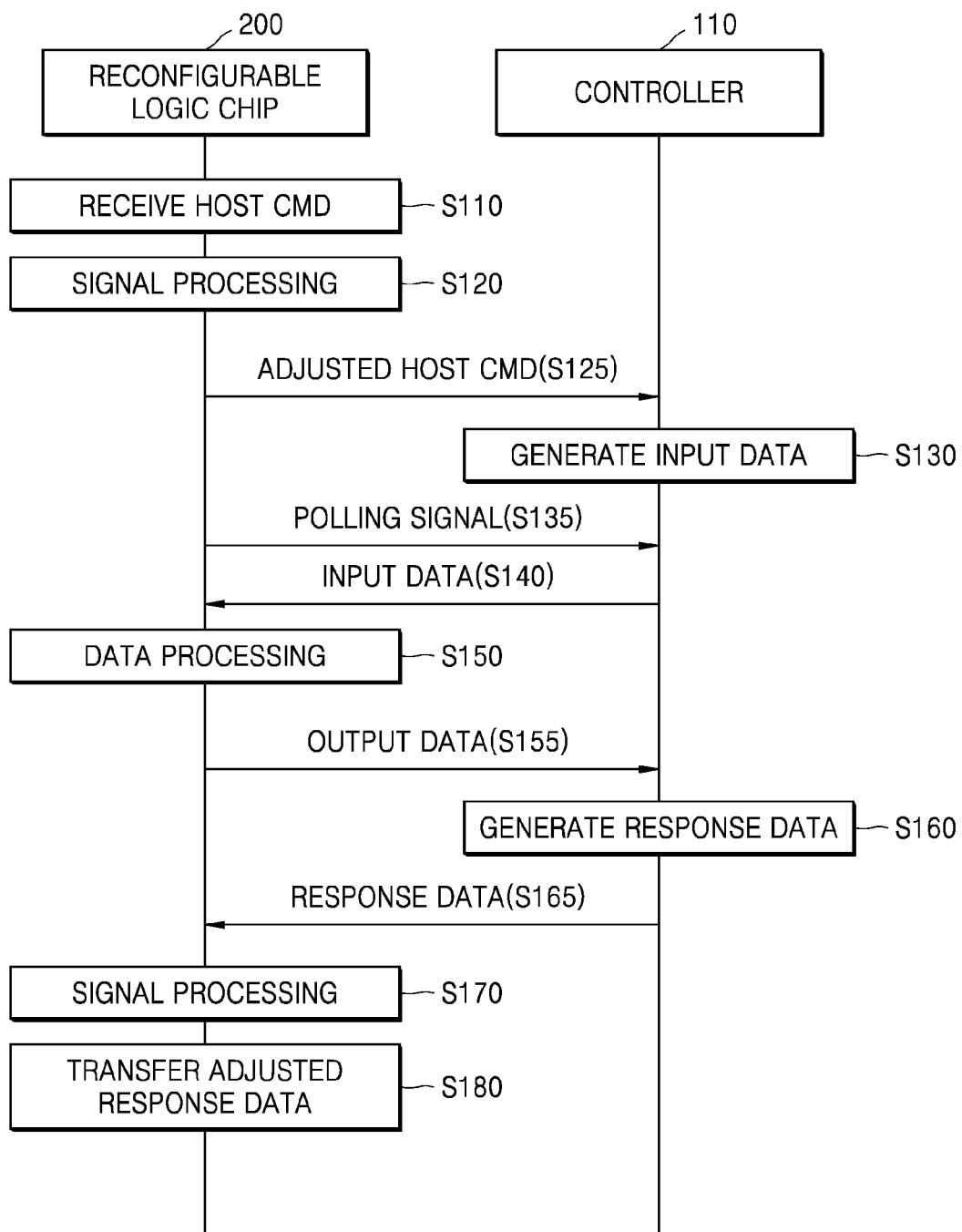
FIG. 4 is a flowchart of an example of operations of a reconfigurable logic chip and a controller, according to an example embodiment.

FIG. 4 is a flowchart of an example of operations of the reconfigurable logic chip 200 and the controller 110, according to an example embodiment. In particular, FIG. 4 is a flowchart showing an example of operations of the reconfigurable logic chip 200 and the controller 110 of FIG. 3. For convenience of description, FIG. 4 will also be described under an assumption that the host 300 and the storage device set 10 operate based on the NVMe protocol and the interfaces respectively included in the host 300 and the storage device set 10 follow a PCIe method supporting the NVMe protocol.

Referring to FIGS. 3 and 4, the reconfigurable logic chip 200 may receive a host command, in operation S110. In particular, the retimer 210 of the reconfigurable logic chip 200 may receive the host command. Then, the reconfigurable logic chip 200 may perform signal processing on the host command, in operation S120. In particular, the retimer 210 of the reconfigurable logic chip 200 may remove jitter of the host command and repair a loss to perform the signal processing on the host command.

Then, the reconfigurable logic chip 200 may transmit the adjusted host command to the controller 110, in operation S125. In particular, the retimer 210 of the reconfigurable logic chip 200 may transmit the host command on which the signal processing is performed to the controller 110 via the first port PT1. Then, the controller 110 may generate input data based on the received host command, in operation S130.

Then, the reconfigurable logic chip 200 may transmit a polling signal to the controller 110, in operation S135. In particular, the operation circuit 220 of the reconfigurable logic chip 200 may transmit the polling signal requesting transmission of the input data to the controller 110 via the second port PT2. According to an example embodiment, the operation circuit 220 may transmit, to the controller 110, the polling signal according to a method pre-agreed with the controller 110. According to an example embodiment, the operation circuit 220 may transmit the polling signal to the controller 110 according to a pre-set period.

Also, the controller 110 may transmit the input data to the reconfigurable logic chip 200 in response to the polling signal, in operation S140. In particular, the controller 110 may maintain a standby state after generating the input data. The controller 110 may transmit, to the operation circuit 220 of the reconfigurable logic chip 200, the input data via the second port PT2 upon receiving the polling signal from the operation circuit 220. Example embodiments are not limited thereto, and the controller 110 may generate the input data after receiving the polling signal from the operation circuit 220 and transmit the generated input data to the operation circuit 220. According to an example embodiment, the controller 110 may transmit, to the operation circuit 220, a command indicating an operation requested by the host 300, together with the input data.

Then, the reconfigurable logic chip 200 may perform data processing based on the received input data, in operation S150. In particular, the operation circuit 220 of the reconfigurable logic chip 200 may generate output data by performing an operation corresponding to the received command, by using the input data. The reconfigurable logic chip 200 may transmit the output data to the controller 110, in operation S155. In particular, the operation circuit 220 of the reconfigurable logic chip 200 may transmit the output data to the controller 110 via the second port PT2.

Then, the controller 110 may generate response data based on the output data, in operation S160. Then, the controller 110 may transmit the response data to the reconfigurable logic chip 200, in operation S165. In particular, the controller 110 may transmit the response data to the retimer 210 of the reconfigurable logic chip 200 via the first port PT1. Then, the reconfigurable logic chip 200 may perform signal processing on the response data, in operation S170. In particular, the retimer 210 of the reconfigurable logic chip 200 may remove jitter of the response data and repair a loss to perform the signal processing on the response data. Then, the reconfigurable logic chip 200 may transmit the adjusted response data to the host 300, in operation S180. In particular, the retimer 210 of the reconfigurable logic chip 200 may transmit, to the host 300, the response data on which the signal processing is performed.

Figure 5:
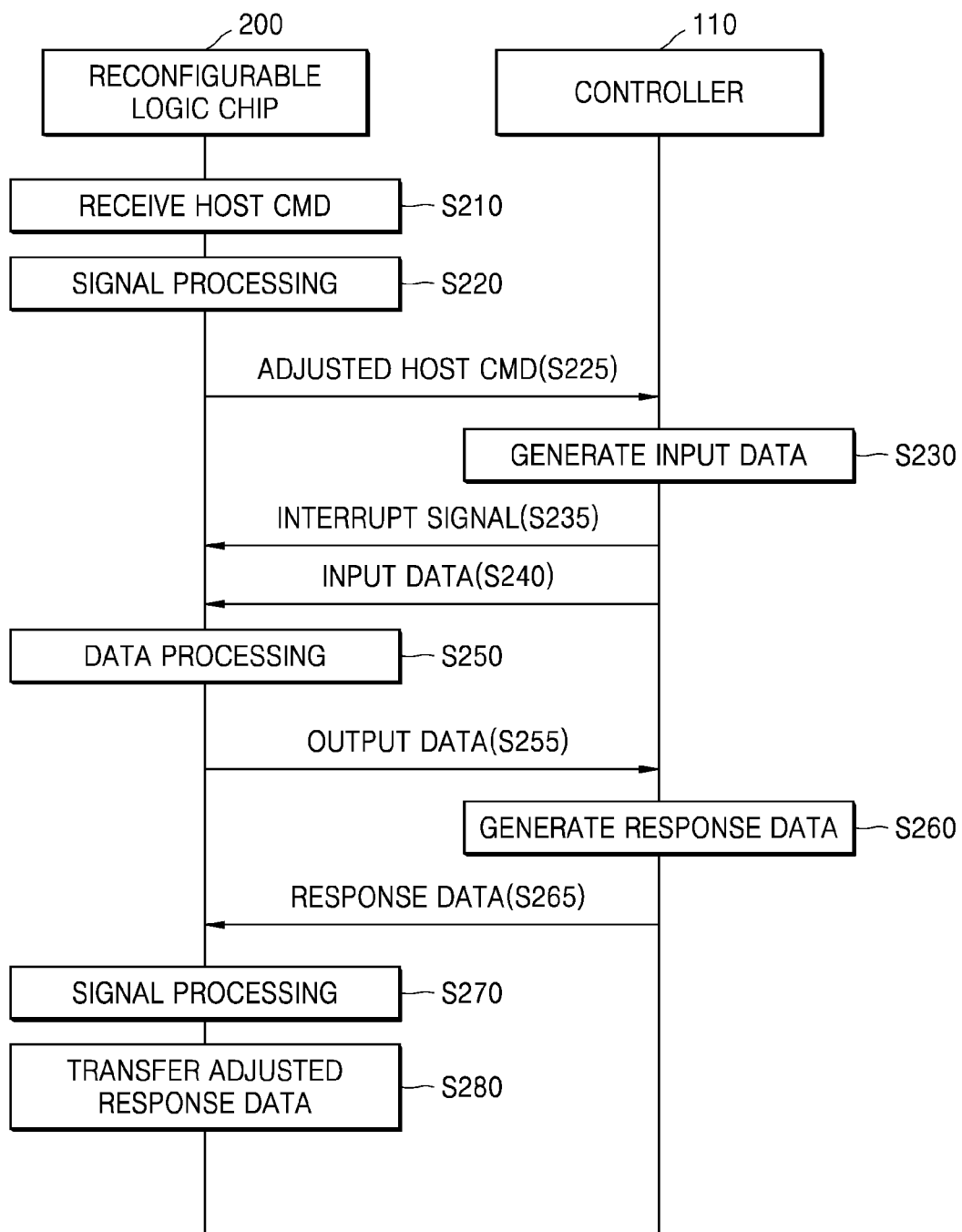
FIG. 5 is a flowchart of an example of operations of a reconfigurable logic chip and a controller, according to an example embodiment.

FIG. 5 is a flowchart of an example of operations of the reconfigurable logic chip 200 and the controller 110, according to an example embodiment. In particular, FIG. 5 is a modified example of FIG. 4, according to an example embodiment. Because operations S210 to S230 of FIG. 5 may be substantially the same as operations S110 to S130 of FIG. 4, repeated descriptions thereof are omitted.

Referring to FIG. 5, the controller 110 may transmit an interrupt signal to the reconfigurable logic chip 200, in operation S235. In particular, the controller 110 may transmit the interrupt signal indicating a data transmission schedule to the operation circuit 220 of the reconfigurable logic chip 200 via the second port PT2. According to an example embodiment, the controller 110 may transmit the interrupt signal to the operation circuit 220 according to a method pre-agreed with the operation circuit 220.

Then, the controller 110 may transmit the input data to the reconfigurable logic chip 200, in operation S240. In particular, the controller 110 may transmit the input data to the operation circuit 220 via the second port PT2 after transmitting the interrupt signal. Example embodiments are not limited thereto, and the controller 110 may generate the input data after transmitting the interrupt signal to the operation circuit 220 and transmit the generated input data to the operation circuit 220. According to an example embodiment, the controller 110 may transmit, to the operation circuit 220, a command indicating an operation requested by the host 300, together with the input data. Moreover, because operations S250 to S280 may be substantially the same as operations S150 to S180 of FIG. 4, repeated descriptions thereof are omitted.

As such, because the storage device sets 10 according to example embodiments consistent with FIGS. 4 and 5 transmit and receive data based on the same protocol, the controller 110 and the reconfigurable logic chip 200 may transmit and receive data directly to and from each other.

Figure 6:
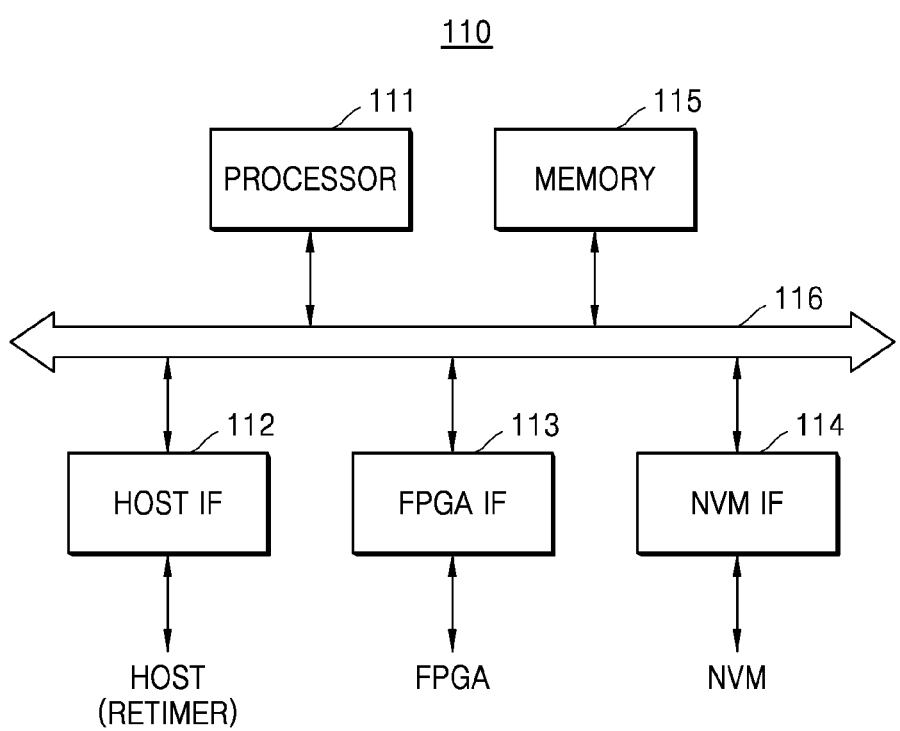
FIG. 6 is a block diagram showing a configuration of a controller, according to an example embodiment.

FIG. 6 is a block diagram showing a configuration of the controller 110, according to an example embodiment. In particular, FIG. 6 is a block diagram of a configuration of the controller 110 of FIG. 2.

Referring to FIG. 6, the controller 110 includes a processor 111, a host interface (IF) 112, a FPGA IF 113, a NVM IF 114, and a memory 115, which communicate with each other via a bus 116. For example, the reconfigurable logic chip 200 may include a FPGA.

The processor 111 may include a central processing unit or a micro-processor, and control overall operations of the controller 110. According to an example embodiment, the processor 111 may be configured as a multi-core processor and for example, may be configured as a dual-core processor or a quad-core processor. According to an example embodiment, the processor 111 may control overall operations related to a host command received from a host. For example, the processor 111 may generate input data based on the received host command and generate response data based on received output data.

The host IF 112 may provide an IF between the host 300 and the controller 110 via the retimer 210 of FIG. 1, and for example, may include the first port PT1 of FIG. 1. The FPGA IF 113 may provide an IF between the controller 110 and the FPGA, i.e., the operation circuit 220 of the reconfigurable logic chip 200 of FIG. 1, and for example, may include the second port PT2 of FIG. 1.

According to an example embodiment, the host IF 112 may receive the host command from the retimer 210 of FIG. 1 and provide the received host command to the processor 111. Also, the FPGA IF 113 may receive the input data from the processor 111 and provide the received input data to the operation circuit 220 of FIG. 1. Also, the FPGA IF 113 may receive output data from the operation circuit 220 of FIG. 1 and provide the received output data to the processor 111. Also, the host IF 112 may receive response data from the processor 111 and provide the received response data to the retimer 210 of FIG. 1.

The NVM IF 114 may provide an IF between the controller 110 and the NVM 120. The memory 115 operates according to control of the processor 111 and may be used as an operation memory, a buffer memory, or a cache memory. For example, the memory 115 may be configured as a volatile memory such as dynamic random access memory (DRAM) or static random access memory (SRAM), or an NVM such as phase-change random access memory (PRAM) or a flash memory.

Figure 7:
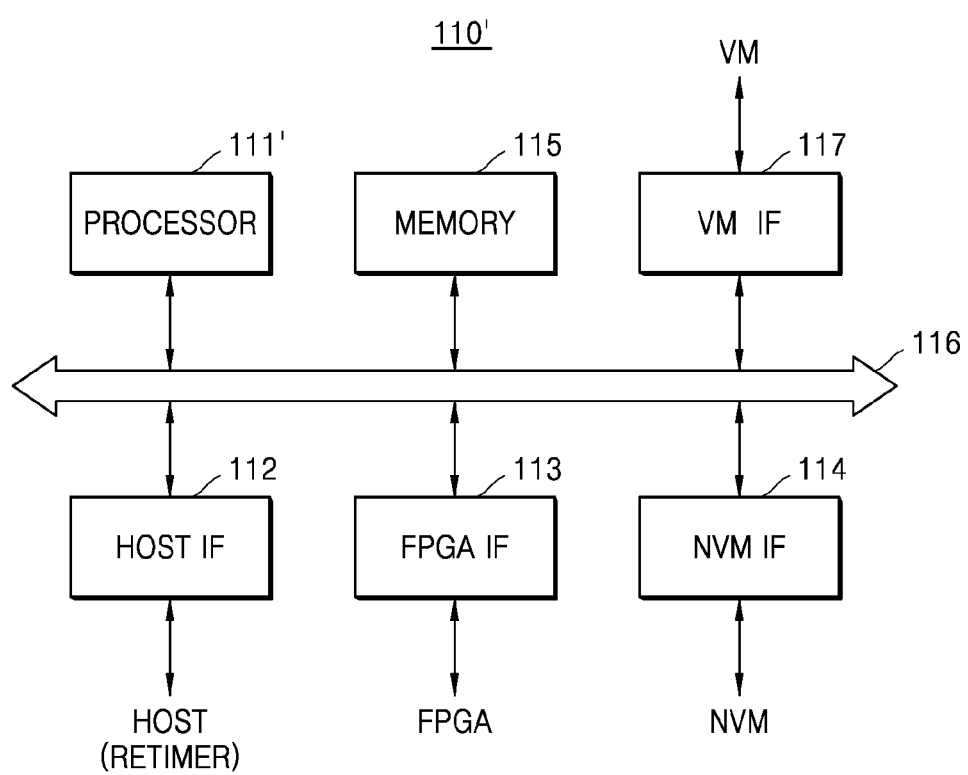
FIG. 7 is a block diagram showing a configuration of a controller, according to an example embodiment.

FIG. 7 is a block diagram showing a configuration of a controller 110', according to an example embodiment. In particular, FIG. 7 is a diagram of a modified example of FIG. 6, according to an example embodiment.

Referring to FIG. 7, the controller 110' includes a processor 111', the host IF 112, the FPGA IF 113, the NVM IF 114, the memory 115, and a volatile memory (VM) IF 117, which communicate with each other via the bus 116. Hereinafter, differences between the controller 110' and the controller 110 of FIG. 6 will be mainly described.

The VM IF 117 may provide an IF between the controller 110' and a VM, for example, a VM included in a storage device provided outside the controller 110'. According to an example embodiment, the processor 111' may use the VM during an operation of transmitting and receiving data to and from the operation circuit 220 of FIG. 1. For example, the processor 111' may generate input data based on a received host command and load the generated input data on the VM via the VM IF 117. Also, the processor 111' may read output data generated by the operation circuit 220 of FIG. 1 from the VM via the VM IF 117. Detailed descriptions thereof will be described with reference to FIG. 8.

Figure 8:
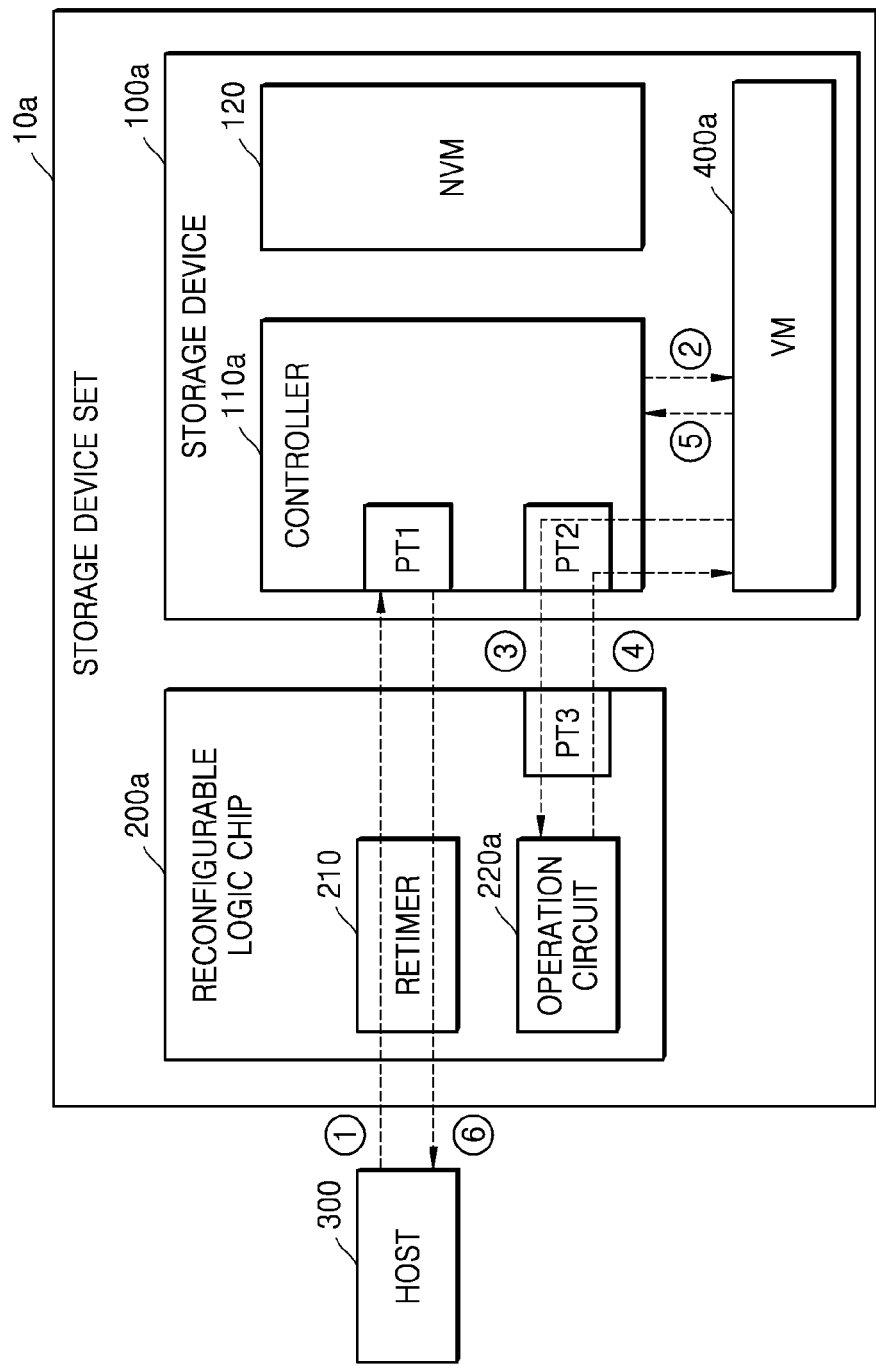
FIG. 8 is a block diagram for describing an operating method of a storage device set, according to an example embodiment.

FIG. 8 is a block diagram for describing an operating method of a storage device set 10a, according to an example embodiment. In other words, FIG. 8 is a diagram of the storage device set 10a including the controller 110' of FIG. 7. In other words, a controller 110a may be substantially the same as the controller 110' of FIG. 7. Referring to FIG. 8, the storage device set 10a may include a VM 400a that may be connected to the controller 110a via the VM IF 117 of FIG. 7 and may not be connected to a reconfigurable logic chip 200a. According to an example embodiment, the VM 400a may include a VM such as DRAM.

The reconfigurable logic chip 200a and a storage device 100a may pre-agree on a certain memory region, and transmit and receive data by using the agreed memory region. For example, the reconfigurable logic chip 200a and the storage device set 10a may load data to be transmitted on the agreed memory region, and read data to be received from the agreed memory region.

According to an example embodiment, the memory region agreed between the reconfigurable logic chip 200a and the storage device 100a may be a partial region of the VM 400a of the storage device 100a. The reconfigurable logic chip 200a and the storage device 100a may each store an address regarding the partial region of the VM 400a and access the partial region of the VM 400a based on the stored address when data transmission and reception is required.

Referring to FIG. 8, the host 300 may transmit a host command to the storage device set 10a. According to an example embodiment, the host 300 may transmit the host command to the retimer 210, and the retimer 210 may adjust the host command and transmit the adjusted host command to the controller 110a via the first port PT1 (operation ①).

Then, the controller 110a may generate a command indicating an operation requested by the host 300, based on the host command, and input data required to perform the operation requested by the host 300.

Then, the controller 110a may load the input data on the VM 400a (operation ②). According to an example embodiment, the controller 110a may load the input data on the partial region of the VM 400a pre-agreed with the reconfigurable logic chip 200a. Next, an operation circuit 220a may obtain the input data by accessing the VM 400a via the second port PT2 (operation ③). According to an example embodiment, the controller 110a may transmit, to the operation circuit 220a, the command indicating the operation requested by the host 300 via the second port PT2. Then, the operation circuit 220a may obtain the input data by accessing the pre-agreed region of the VM 400a via the VM IF 117 of FIG. 7 and a root connecting the third port PT3 and the second port PT2. Then, the operation circuit 220a may perform the operation by using the input data. The operation circuit 220a may generate output data by performing the operation.

Next, the operation circuit 220a may load the output data on the VM 400a via the second port PT2 (operation ④). According to an example embodiment, the operation circuit 220a may load the output data on the pre-agreed region of the VM 400a by accessing the VM 400a via the VM IF 117 of FIG. 7 and the root connecting the third port PT3 and the second port PT2. Then, the controller 110a may obtain the output data from the VM 400a (operation ⑤). According to an example embodiment, the controller 110a may read the output data from the partial region of the VM 400a pre-agreed with the reconfigurable logic chip 200a. Then, the controller 110a may generate response data regarding the host command, based on the output data.

Next, the controller 110a may transmit the response data to the host 300 (operation ⑥). According to an example embodiment, the controller 110a may transmit the response data to the retimer 210, and the retimer 210 may adjust the response data and transmit the adjusted response data to the host 300 via the first port PT1.

Figure 9:
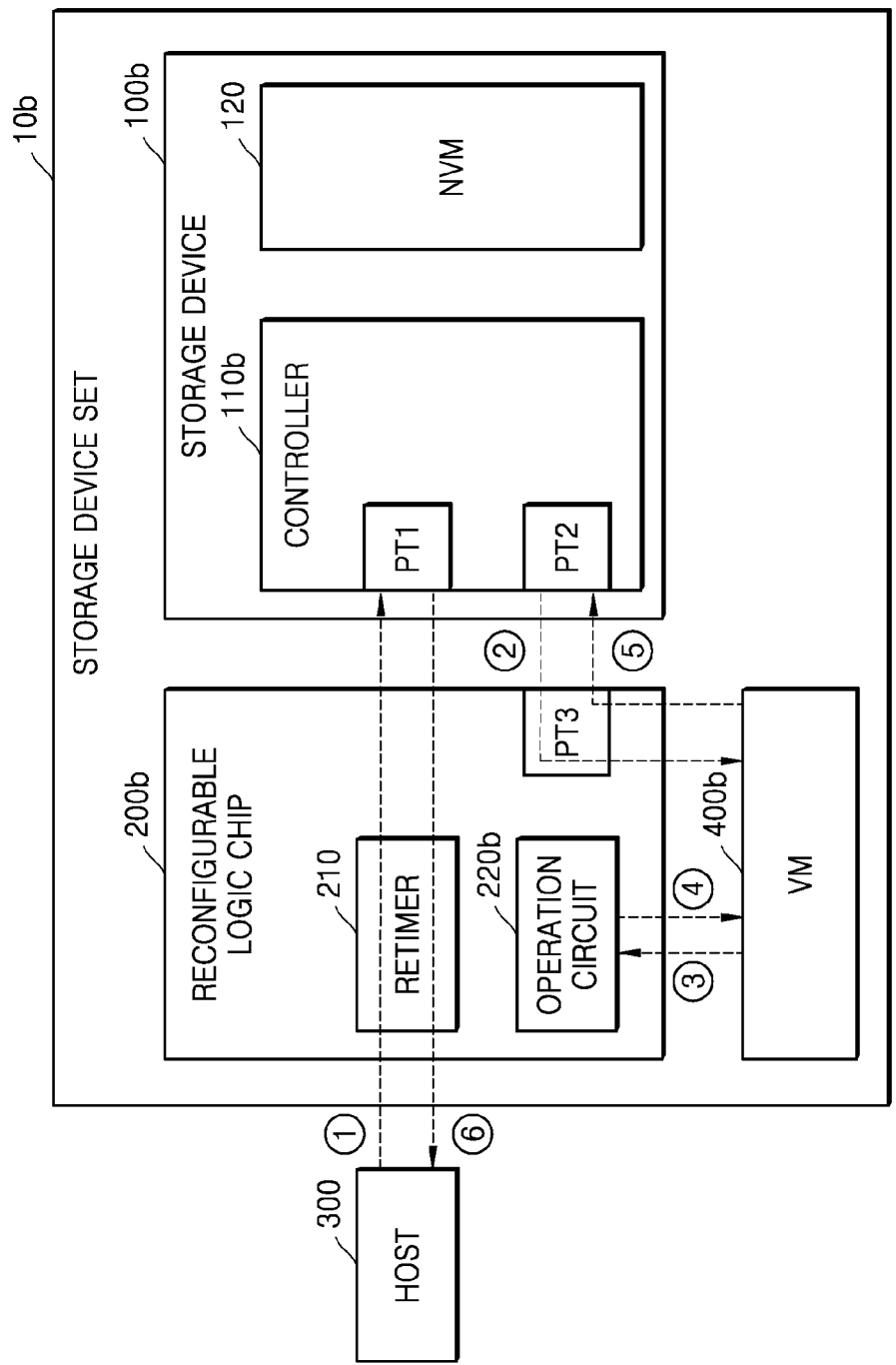
FIG. 9 is a block diagram for describing an operating method of a storage device set, according to an example embodiment.

FIG. 9 is a block diagram for describing an operating method of a storage device set 10b, according to an example embodiment. In particular, FIG. 9 is a diagram of a modified example of FIG. 8, according to an example embodiment. Referring to FIG. 9, the storage device set 10b according to the current embodiment may include a VM 400b that may be connected to a reconfigurable logic chip 200b via a VM IF of the reconfigurable logic chip 200b and may not be connected to a controller 110b. According to an example embodiment, the VM 400b may include a VM such as DRAM.

The reconfigurable logic chip 200b and a storage device 100b may pre-agree on a certain memory region, and transmit and receive data by using the agreed memory region. The memory region agreed between the reconfigurable logic chip 200b and the storage device 100b may be a partial region of the VM 400b of the storage device 100b.

Referring to FIG. 9, the host 300 may transmit a host command to the storage device set 10b. According to an example embodiment, the host 300 may transmit the host command to the retimer 210, and the retimer 210 may adjust the host command and transmit the adjusted host command to the controller 110b via the first port PT1 (operation ①). Then, the controller 110b may generate a command indicating an operation requested by the host 300, based on the host command, and input data required to perform the operation requested by the host 300.

Next, the controller 110b may load the input data on the VM 400b via the second port PT2 (operation ②). According to an example embodiment, the controller 110b may access the VM 400b via a VM IF of the reconfigurable logic chip 200b and a root connecting the second port PT2 and the third port PT3, and load the input data on the pre-agreed region of the VM 400b.

An operation circuit 220b may obtain the input data from the VM 400b (operation ③). According to an example embodiment, the controller 110b may transmit, to the operation circuit 220b, the command indicating the operation requested by the host 300 via the second port PT2. Then, the operation circuit 220b may read the input data from the partial region of the VM 400b pre-agreed with the storage device 100b. Then, the operation circuit 220b may perform the operation by using the input data. The operation circuit 220b may generate output data by performing the operation.

Next, the operation circuit 220b may load the output data on the VM 400b (operation ④). According to an example embodiment, the operation circuit 220b may load the output data on the partial region of the VM 400b pre-agreed with the storage device 100b. Next, the controller 110b may obtain the output data by accessing the VM 400b via the second port PT2 (operation ⑤). According to an example embodiment, the controller 110b may access the VM 400b via a VM IF of the reconfigurable logic chip 200b and the root connecting the second port PT2 and the third port PT3, and read the output data from the pre-agreed region of the VM 400b. Then, the controller 110b may generate response data regarding the host command, based on the output data.

Next, the controller 110b may transmit the response data to the host 300 (operation ⑥). According to an example embodiment, the controller 110b may transmit the response data to the retimer 210, and the retimer 210 may adjust the response data and transmit the adjusted response data to the host 300 via the first port PT1.

Figure 10:
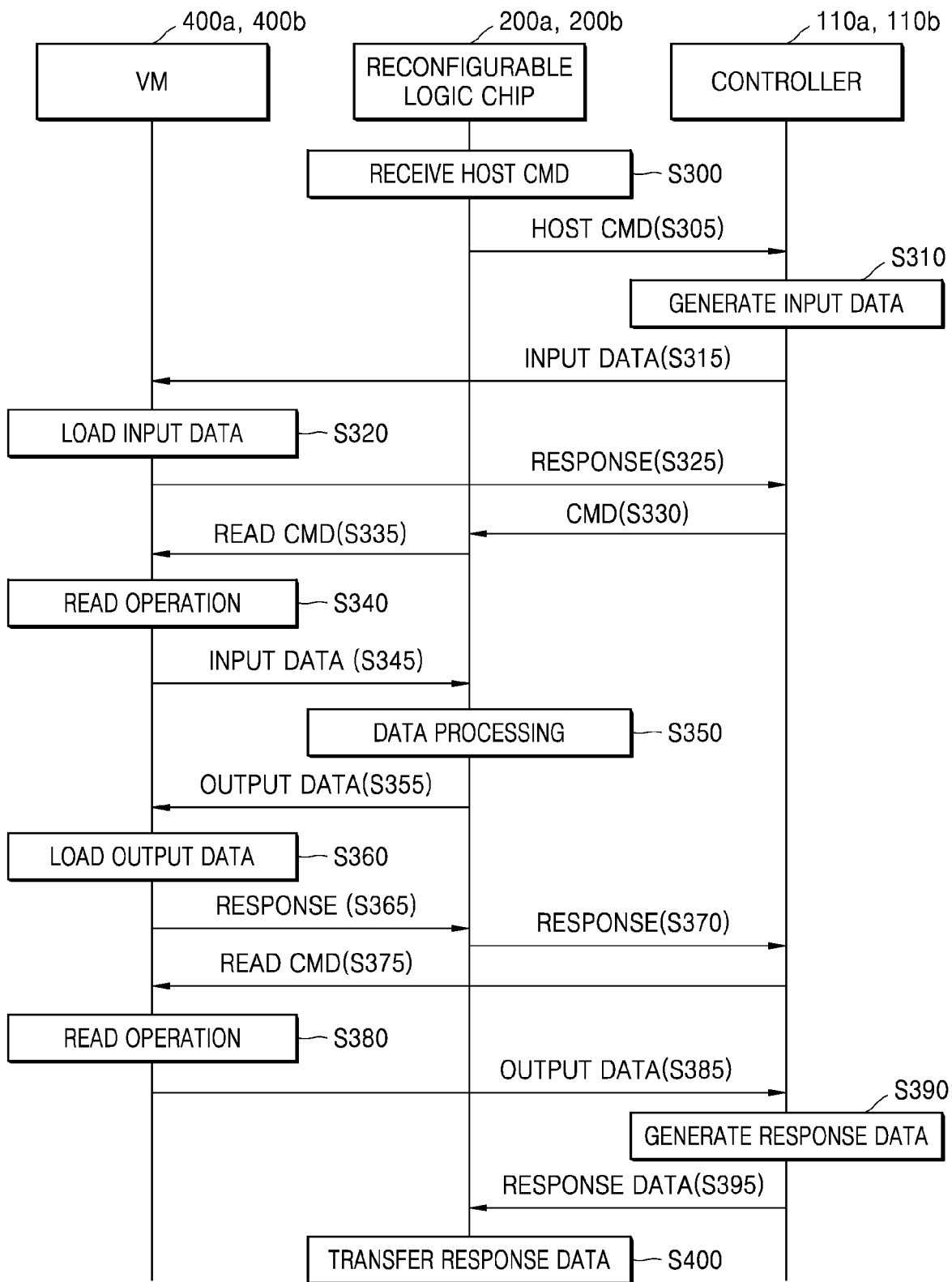
FIG. 10 is a flowchart of an example of operations of a volatile memory, a reconfigurable logic chip, and a controller, according to an example embodiment.

FIG. 10 is a flowchart of an example of operations of the VMs 400a an 400b, the reconfigurable logic chips 200a and 200b, and the controllers 110a an 110b, according to an example embodiment. In particular, FIG. 10 is a flowchart of an example of operations of the VMs 400a and 400b, the reconfigurable logic chips 200a and 200b, and the controllers 110a and 110b.

Referring to FIG. 10, the reconfigurable logic chips 200a and 200b may receive a host command, in operation S300. In particular, the retimer 210 of the reconfigurable logic chips 200a and 200b may receive the host command. Then, the reconfigurable logic chips 200a and 200b may perform signal processing on the host command. In particular, the retimer 210 of the reconfigurable logic chips 200a and 200b may remove jitter of the host command and repair a loss to perform the signal processing on the host command.

Then, the reconfigurable logic chips 200a and 200b may transmit the adjusted host command to the controllers 110a and 110b, in operation S305. In particular, the retimer 210 of the reconfigurable logic chips 200a and 200b may transmit the host command on which the signal processing is performed to the controllers 110a and 110b via the first port PT1. Then, the controllers 110a and 110b may generate input data based on the received host command, in operation S310.

Then, the controllers 110a and 110b may transmit the input data to the VMs 400a and 400b, in operation S315. In particular, the controllers 110a and 110b may transmit the input data to the VMs 400a and 400b, together with a command requesting the input data to be written to partial regions of the VMs 400a and 400b pre-agreed with the reconfigurable logic chips 200a and 200b.

Then, the VMs 400a and 400b may load the input data, in operation S320. Next, the VMs 400a and 400b may transmit, to the controllers 110a and 110b, a response message indicating completion of the loading. In particular, the VMs 400a and 400b may load the input data on the pre-agreed region and transmit the response message indicating the completion of the loading to the controllers 110a and 110b. Then, the controllers 110a and 110b may transmit a command indicating an operation requested by the host 300 to the reconfigurable logic chips 200a and 200b, in operation S330.

Then, the reconfigurable logic chips 200a and 200b may transmit a read command to the VMs 400a and 400b, in operation S335. In particular, the operation circuits 220a and 220b of the reconfigurable logic chips 200a and 200b may transmit, to the VMs 400a and 400b, the read command requesting data written in an address of the pre-agreed region to be read, in response to the received command.

Then, the VMs 400a and 400b may read the input data, in operation S340. Next, the VMs 400a and 400b may transmit the read input data to the reconfigurable logic chips 200a and 200b, in operation 345. In particular, the VMs 400a and 400b may read the input data loaded on the pre-agreed region and transmit the read input data to the operation circuits 220a and 220b of the reconfigurable logic chips 200a and 200b.

Then, the reconfigurable logic chips 200a and 200b may perform data processing based on the received input data, in operation S350. In particular, the operation circuits 220a and 220b of the reconfigurable logic chips 200a and 200b may generate output data by performing an operation corresponding to the received command, by using the input data. The reconfigurable logic chips 200a and 200b may transmit the output data to the controllers 110a and 110b, in operation S355. In particular, the operation circuits 220a and 220b of the reconfigurable logic chips 200a and 200b may transmit, to the VMs 400a and 400b, the input data together with a command requesting the output data to be written to partial regions of the VMs 400a and 400b pre-agreed with the storage devices 100a and 100b.

Then, the VMs 400a and 400b may load the output data, in operation S360. Next, the VMs 400a and 400b may transmit a response message indicating completion of the loading to the reconfigurable logic chips 200a and 200b, in operation S365. In particular, the VMs 400a and 400b may load the output data on the pre-agreed region and transmit the response message indicating the completion of the loading to the operation circuits 220a and 220b of the reconfigurable logic chips 200a and 200b.

Then, the reconfigurable logic chips 200a and 200b may transmit the response message indicating the completion of the operation to the controllers 110a and 110b, in operation S370. In particular, the operation circuits 220a and 220b of the reconfigurable logic chips 200a and 200b may transmit the response message indicating the completion of the operation to the controllers 110a and 110b. Then, the controllers 110a and 110b may transmit a read command to the VMs 400a and 400b, in operation S375. In particular, the controllers 110a and 110b may transmit, to the VMs 400a and 400b, the read command requesting the data written to the address of the pre-agreed region to be read.

Then, the VMs 400a and 400b may read the output data, in operation S380. Next, the VMs 400a and 400b may transmit the read output data to the controllers 110a and 110b, in operation S385. In particular, the VMs 400a and 400b may read the output data loaded on the pre-agreed region and transmit the read output data to the controllers 110a and 110b.

Then, the controllers 110a and 110b may generate response data based on the output data, in operation S390. Then, the controllers 110a and 110b may transmit the response data to the reconfigurable logic chips 200a and 200b, in operation S395. In particular, the controllers 110a and 110b may transmit the response data to the retimer 210 of the reconfigurable logic chips 200a and 200b via the first port PT1. Then, the reconfigurable logic chips 200a and 200b may transmit the response data to the host 300 in operation S400. In particular, the retimer 210 of the reconfigurable logic chips 200a and 200b may remove jitter of the response data and repair a loss to perform the signal processing on the response data. Then, the retimer 210 of the reconfigurable logic chips 200a and 200b may transmit the adjusted response data to the host 300.

As such, because the storage device set according to an example embodiment of FIG. 10 uses a VM, the host 300, the controllers 110a and 110b, and the reconfigurable logic chips 200a and 200b may communicate with each other even when they operate based on different protocols.

Figure 11:
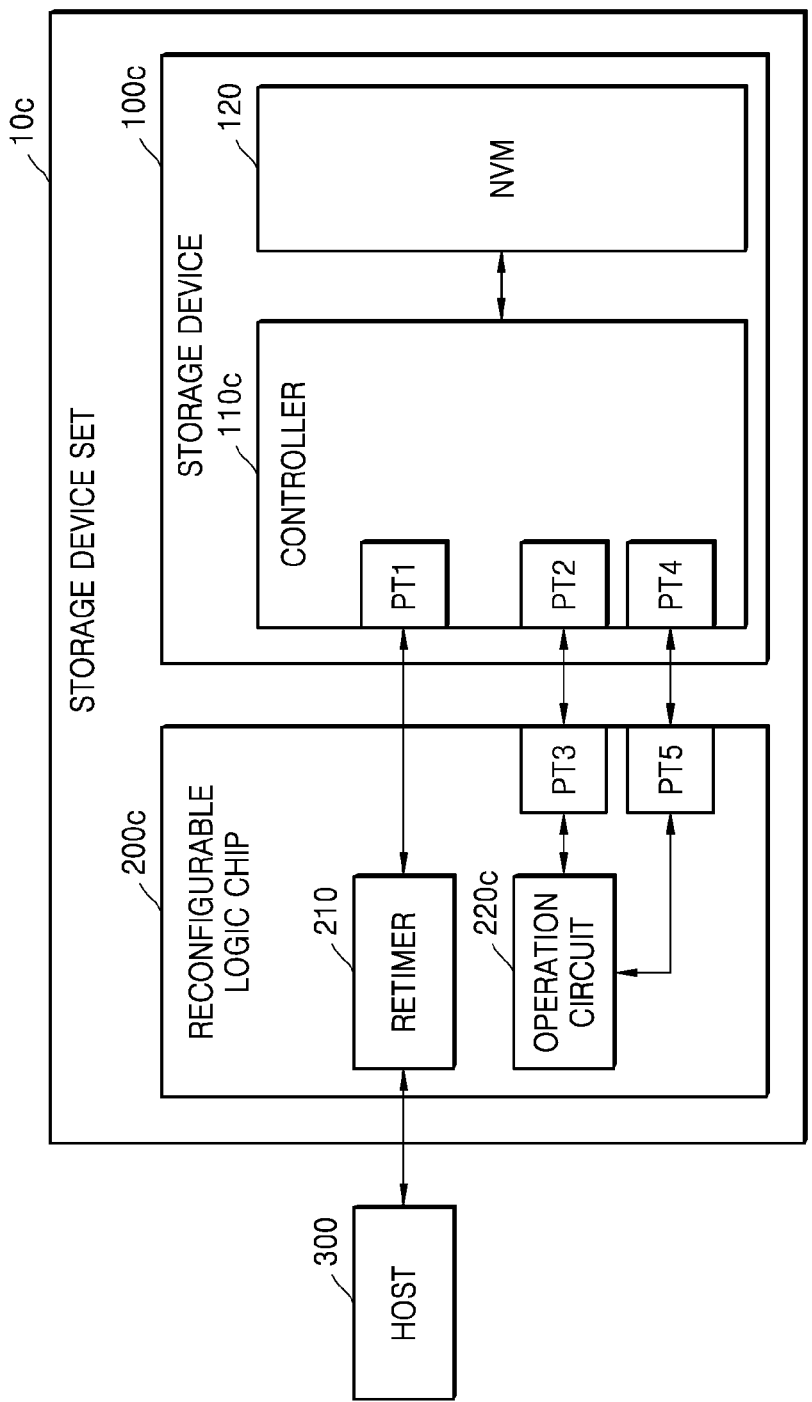
FIG. 11 is a block diagram showing in detail a storage device set according to an example embodiment.

FIG. 11 is a block diagram showing in detail a storage device set 10c according to an example embodiment. In particular, FIG. 11 is a block diagram showing a modified example of the storage device set 10 of FIG. 2, according to an example embodiment. Referring to FIG. 11, the storage device set 10c may include a storage device 100c and a reconfigurable logic chip 200c. The storage device 100c may include a controller 110c and the NVM 120, and the reconfigurable logic chip 200c may include the retimer 210 and an operation circuit 220c.

Referring to FIG. 11, the controller 110c may include a fourth port PT4 in addition to the first port PT1 connected to the retimer 210 and the second port PT2 connected to the third port PT3. The reconfigurable logic chip 200c may include a fifth port PT5 connected to the operation circuit 220c and distinguished from the third port PT3. The storage device set 10c may include a root connecting the fourth port PT4 and the fifth port PT5. Here, the root connecting the fourth port PT4 and the fifth port PT5 may perform a function of a side band connecting the storage device 100c and the reconfigurable logic chip 200c, and may be an I2C/SM bus.

The controller 110c may receive a host command via the retimer 210 and the first port PT1. Then, the controller 110c may generate a command indicating an operation requested by the host 300 and input data required to perform the operation requested by the host 300, in response to the received host command.

Then, the controller 110c may provide the command to the operation circuit 220c via the fourth port PT4 instead of the second port PT2. According to an example embodiment, the controller 110c may transmit the command to the operation circuit 220c via the root (for example, I2C/SM bus) connecting the fourth port PT4 and the fifth port PT5.

Then, the controller 110c may transmit the input data to the operation circuit 220c via the second port PT2. According to an example embodiment, when the host 300 and the storage device set 10c operate based on the same protocol (for example, an NVMe protocol), the controller 110c may directly transmit the input data to the operation circuit 220c via a root (for example, a PCIe bus) connecting the second port PT2 and the third port PT3.

Then, the operation circuit 220c may perform the operation corresponding to the request of the host 300, based on the input data and the command received via different roots. According to an example embodiment, the operation circuit 220c may perform the operation corresponding to the command received via the fourth port PT4 and the fifth port PT5 by using the input data received via the second port PT2 and the third port PT3. The operation circuit 220c may generate output data based on the NVMe protocol by performing the operation.

Next, the operation circuit 220c may transmit the output data to the controller 110c via the second port PT2. According to an example embodiment, the operation circuit 220c may directly transmit the output data to the controller 110c via the third port PT3 and the second port PT2.

Figure 12:
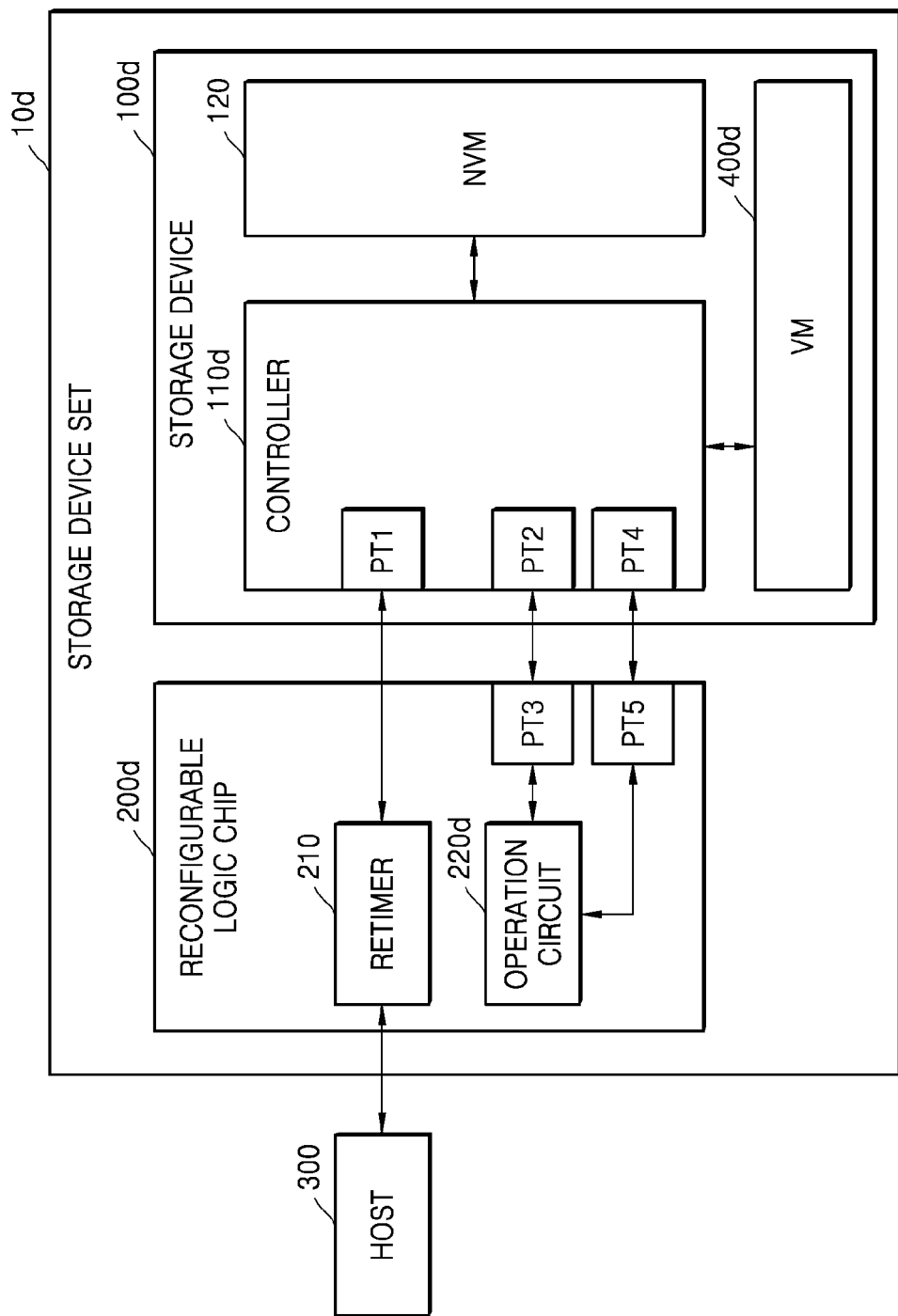
FIG. 12 is a block diagram showing in detail a storage device set according to an example embodiment.

FIG. 12 is a block diagram showing in detail a storage device set 10d according to an example embodiment. In particular, FIG. 12 is a block diagram showing a modified example of the storage device set 10c of FIG. 11, according to an example embodiment. Referring to FIG. 12, the storage device set 10d may additionally include a VM 400d. The VM 400d may be connected to a controller 110d via a VM IF of the controller 110d and may not be connected to a reconfigurable logic chip 200d. According to an example embodiment, the VM 400d may include a VM such as DRAM.

Referring to FIG. 12, the controller 110d may receive a host command via the retimer 210 and the first port PT1. Then, the controller 110d may generate a command indicating an operation requested by the host 300 and input data required to perform the operation requested by the host 300, in response to the received host command.

Then, the controller 110d may provide the command to an operation circuit 220d via the fourth port PT4 instead of the second port PT2. According to an example embodiment, the controller 110d may transmit the command to the operation circuit 220d via a root (for example, I2C/SM bus) connecting the fourth port PT4 and the fifth port PT5.

Then, the controller 110d may store the input data in the VM 400d. According to an example embodiment, the controller 110d may store the input data in a partial region of the VM 400d pre-agreed with the reconfigurable logic chip 200d. Next, the operation circuit 220d may obtain the input data by accessing the VM 400d via the second port PT2 instead of the fourth port PT4. According to an example embodiment, the operation circuit 220d may obtain the input data by accessing the pre-agreed region of the VM 400d via a VM IF and a root connecting the third port PT3 and the second port PT2. Then, the operation circuit 220d may perform an operation by using the input data. The operation circuit 220d may generate output data by performing the operation.

Next, the operation circuit 220d may store the output data on the VM 400d via the second port PT2. According to an example embodiment, the operation circuit 220d may store the output data in the pre-agreed region of the VM 400d by accessing the VM 400d via the VM IF and the root connecting the third port PT3 and the second port PT2. Then, the controller 110d may obtain the output data from the VM 400d. According to an example embodiment, the controller 110d may read the output data from the partial region of the VM 400d pre-agreed with the reconfigurable logic chip 200d.

Figure 13:
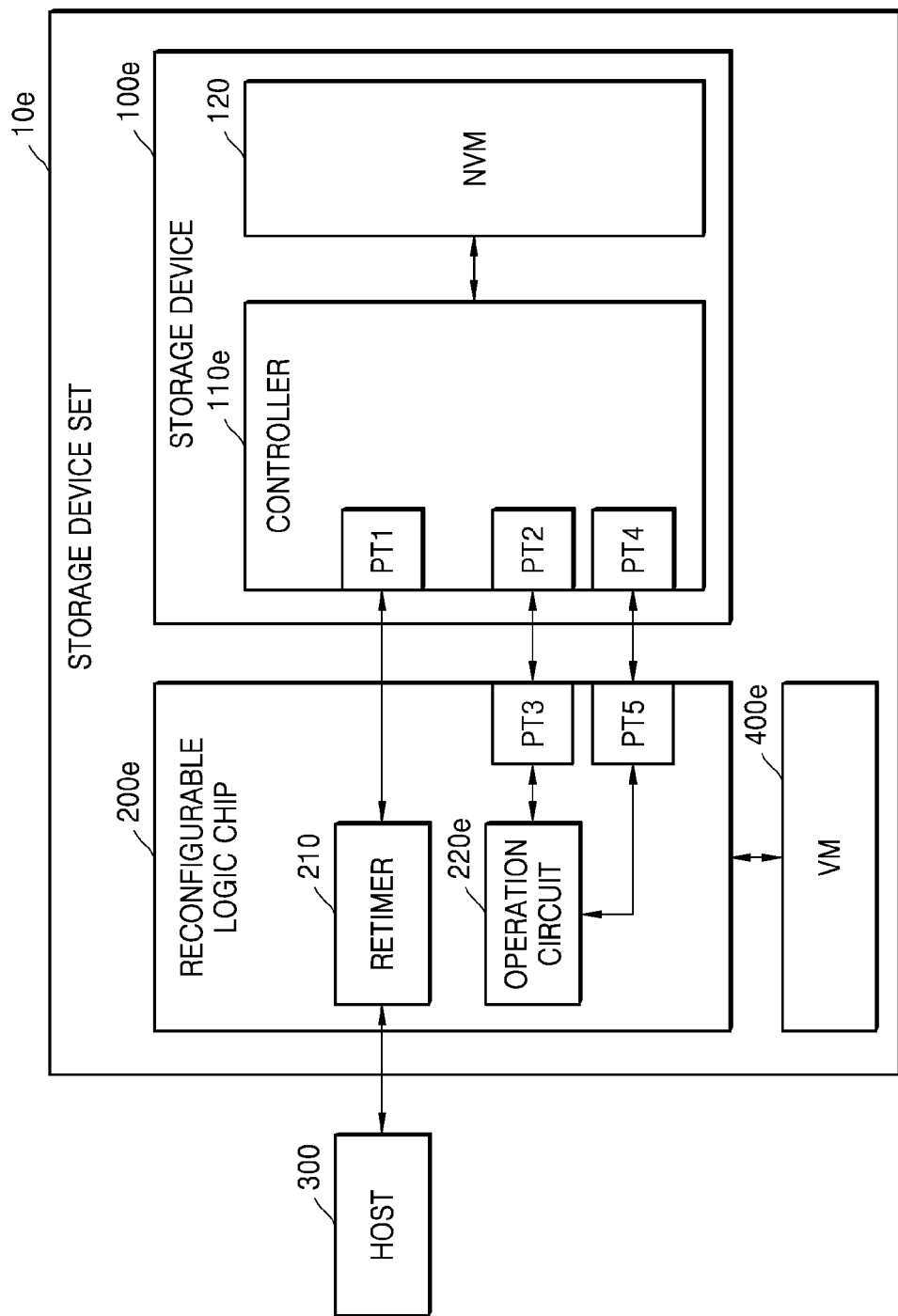
FIG. 13 is a block diagram showing in detail a storage device set according to an example embodiment.

FIG. 13 is a block diagram showing in detail a storage device set 10e according to an example embodiment. In particular, FIG. 13 is a block diagram showing a modified example of the storage device set 10d of FIG. 12, according to an example embodiment. Referring to FIG. 13, the storage device set 10e may additionally include a VM 400e. The VM 400e may be connected to an operation circuit 220e via a VM IF of a reconfigurable logic chip 200e, and may not be connected to a controller 110e. According to an example embodiment, the VM 400e may include a VM such as DRAM.

Referring to FIG. 13, the controller 110e may receive a host command via the retimer 210 and the first port PT1. Then, the controller 110e may generate a command indicating an operation requested by the host 300 and input data required to perform the operation requested by the host 300, in response to the received host command.

Then, the controller 110e may provide the command to the operation circuit 220e via the fourth port PT4 instead of the second port PT2. According to an example embodiment, the controller 110e may transmit the command to the operation circuit 220e via the root (for example, I2C/SM bus) connecting the fourth port PT4 and the fifth port PT5.

Next, the controller 110e may store the input data in the VM 400e via the second port PT2. According to an example embodiment, the controller 110e may access the VM 400e via a VM IF of the reconfigurable logic chip 200e and a root (for example, PCIe bus) connecting the second port PT2 and the third port PT3, and store the input data in the pre-agreed region of the VM 400e.

Then, the operation circuit 220e may read the input data from the pre-agreed region of the VM 400e. Then, the operation circuit 220e may perform an operation by using the input data. The operation circuit 220e may generate output data by performing the operation. Next, the operation circuit 220e may store the output data in the pre-agreed region of the VM 400e.

Next, the controller 110e may obtain the output data by accessing the VM 400e via the second port PT2. According to an example embodiment, the controller 110e may access the VM 400c via a VM IF of the reconfigurable logic chip 200e and the root connecting the second port PT2 and the third port PT3, and read the output data from the pre-agreed region of the VM 400e.

As such, a storage device 100e according to FIG. 13 may separately include a root for transmitting and receiving data to and from the host 300, a root for transmitting the command to the reconfigurable logic chip 200e, and a root for transmitting the input data to the reconfigurable logic chip 200e.

Figure 14:
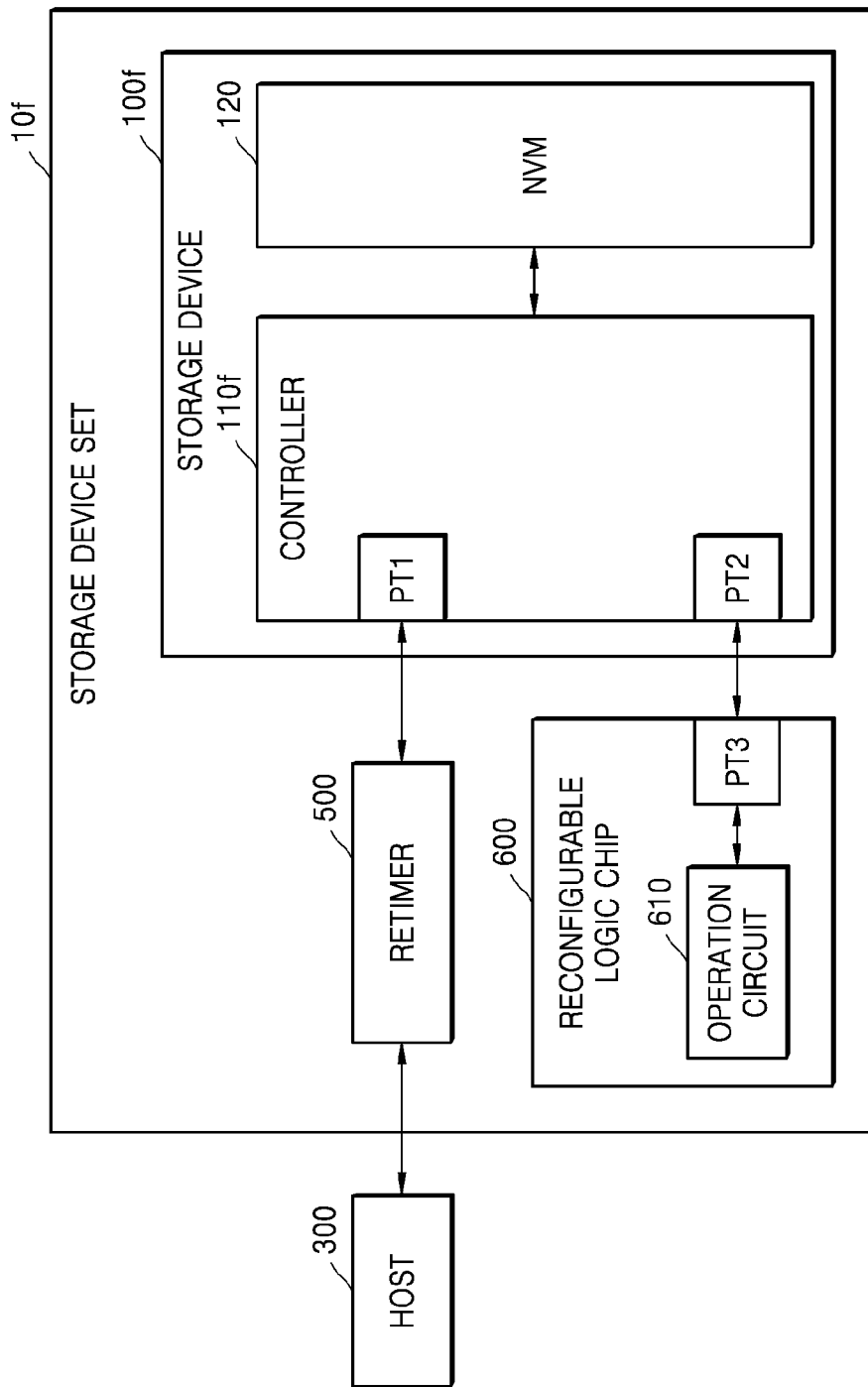
FIG. 14 is a block diagram showing in detail a storage device set according to an example embodiment.

FIG. 14 is a block diagram showing in detail a storage device set 10f according to an example embodiment. Unlike the storage device set 10 of FIG. 1, the storage device set 10f may be configured such that a retimer 500 is provided outside a reconfigurable logic chip 600. According to an example embodiment, the storage device 100 may be implemented via a first chip, the reconfigurable logic chip 200 may be implemented via a second chip, and the retimer 500 may be implemented via a third chip, wherein the first through third chips may configure a package-on-package (POP). A controller 110f of a storage device 100f may include the first port PT1 and the second port PT2, and the reconfigurable logic chip 600 may include an operation circuit 610 and the third port PT3. According to an example embodiment, the storage device set 10f may include a root (for example, PCIe bus) connecting the second port PT2 and the third port PT3.

One end of the retimer 500 may be connected to the host 300 and the other end of the retimer 500 may be connected to the first port PT1 of the controller 110f. Accordingly, the retimer 500 may perform data transmission and reception between the host 300 and the controller 110f. The retimer 500 may receive a host command from the host 300, adjust the received host command, and transmit the adjusted host command to the controller 110f via the first port PT1. Then, the retimer 500 may receive response data from the controller 110f via the first port PT1, adjust the received response data, and transmit the adjusted response data to the host 300. According to an example embodiment, the controller 110f may include a host IF including the first port PT1. The host IF of the controller 110f may communicate with the retimer 500 according to a first interface protocol.

The controller 110f may transmit and receive data to and from the operation circuit 610 via the second port PT2. According to an example embodiment, the controller 110f may transmit and receive data to and from the operation circuit 610 via a bus connecting the second port PT2 and the third port PT3. According to an example embodiment, the controller 110f may include a FPGA IF including the second port PT2. The FPGA IF of the controller 110f may communicate with the operation circuit 610 via a second interface protocol. A method, performed by the controller 110f, of transmitting and receiving data to and from the operation circuit 610 via the second port PT2 may be substantially the same as the method described above with reference to FIGS. 3, 8, and 9. In other words, the controller 110f may directly transmit and receive generated data to and from the operation circuit 610 via the second port PT2, based on the same protocol. Alternatively, the controller 110f may access a region (for example, a partial region of a VM) pre-agreed with the reconfigurable logic chip 600 via the second port PT2. Then, the controller 110f may transmit and receive data to and from the operation circuit 610 by storing the data in the pre-agreed region or reading the data stored in the pre-agreed region.

Figure 15:
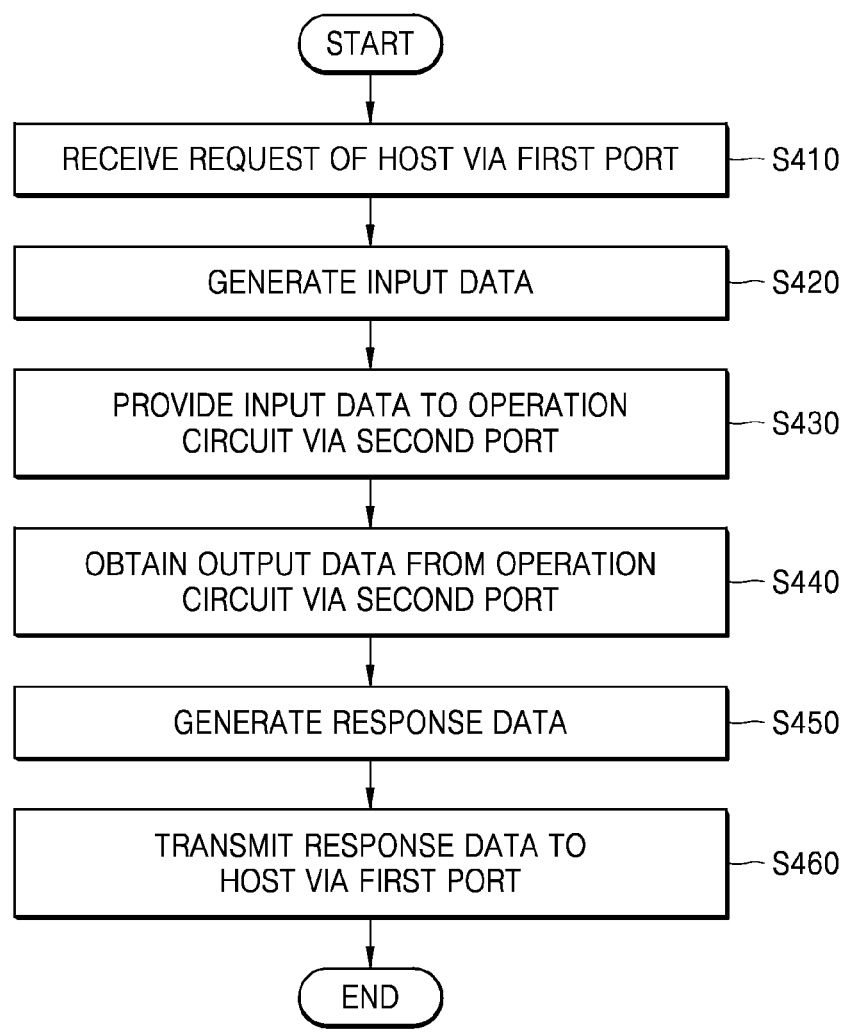
FIG. 15 is a flowchart of an operating method of a storage device, according to an example embodiment.

FIG. 15 is a flowchart of an operating method of a storage device, according to an example embodiment. In particular, the operating method of the storage device may include operations performed in time series by the storage devices 100, 100a, 100b, 100c, 100d, 100e, and 100f of FIGS. 3, 8, 9, 11, 12, 13, and 14.

Referring to FIG. 15, the storage device may receive a request of a host via a first port connected to a retimer (operation S410). According to an example embodiment, the storage device may receive data related to a host command together with the host command, via the first port. According to an example embodiment, the storage device may receive the data related to the host command via the first port after receiving the host command via the first port.

Then, the storage device may generate input data corresponding to the received request (operation S420). According to an example embodiment, the storage device may generate a command indicating an operation requested by the host and the input data required to perform the operation requested by the host, in response to the host command received via the retimer and the first port.

Then, the storage device may provide the input data to an operation circuit via a second port connected to the operation circuit (operation S430). According to an example embodiment, the storage device may transmit the command to the operation circuit together with the input data. According to an example embodiment, the storage device may transmit the command to the operation circuit and then continuously transmit the input data to the operation circuit. According to an example embodiment, the storage device may generate the input data according to a pre-set protocol and directly transmit the generated input data to the operation circuit via the second port. According to an example embodiment, the storage device may store the input data in a region (for example, a VM) pre-agreed with a reconfigurable logic chip, via the second port.

Then, the storage device may obtain, from the operation circuit, output data corresponding to the input data via the second port (operation S440). According to an example embodiment, the storage device may directly receive the output data generated by the operation circuit according to the pre-set protocol, via the second port. According to an example embodiment, the storage device may obtain the output data by reading the output data stored in the region (for example, VM) pre-agreed with the reconfigurable logic chip, via the second port.

Also, the storage device may generate response data corresponding to the received request, based on the output data (operation S450). Next, the storage device may transmit the response data to the host via the first port (operation S460). According to an example embodiment, the storage device may transmit the response data to the host via the first port and the retimer.

As such, the storage device may transmit and receive the data to and from the host via the first port and the retimer, and may transmit and receive data to and from the reconfigurable logic chip by being connected to the operation circuit of the reconfigurable logic chip via the second port.

Also, a storage device set may minimize input and output delay by transmitting and receiving data by using a retimer that performs data transmission and reception via a physical layer, instead of a switch that performs data transmission and reception via a plurality of layers.

Figure 16:
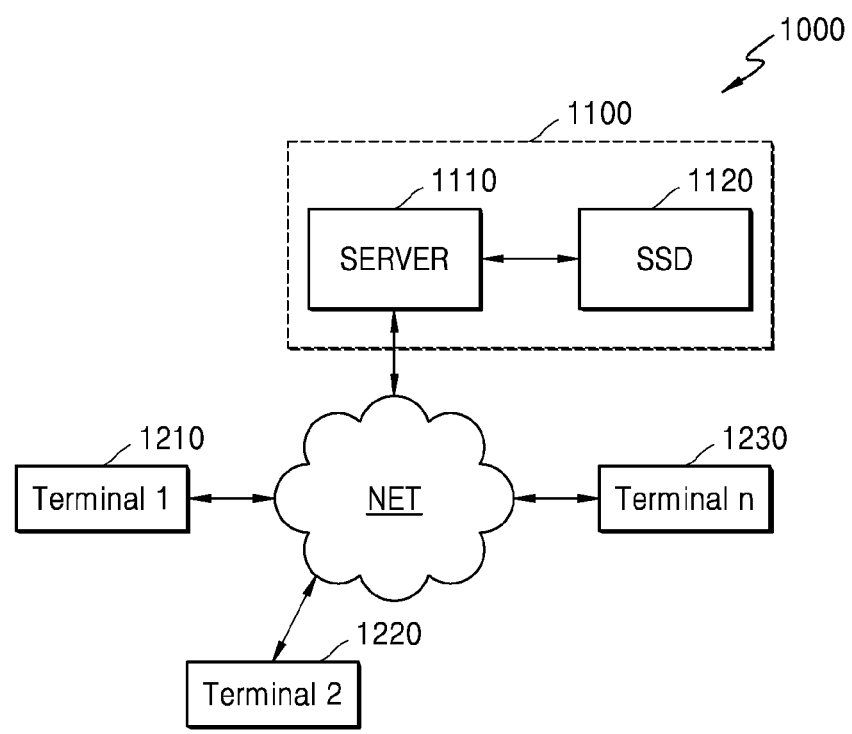
FIG. 16 is a diagram of a network system according to an example embodiment.

FIG. 16 is a diagram of a network system 1000 according to an example embodiment.

Referring to FIG. 16, the network system 1000 may include a server system 1100 and a plurality of terminals 1210 to 1230 communicating with the server system 1100 via a network NET. The server system 1100 may include a server 1110 and SSD 1120. Here, the SSD 1120 may correspond to the storage device 100, 100a, 100b, 100c, 100d, 100e, or 100f of the above described example embodiments. According to some example embodiments, the SSD 1120 may be implemented by using the example embodiments described above with reference to FIGS. 1 through 15.

At least one of the retimer, reconfigurable logic chip, operation circuit, controller, processor or other element represented by a block as illustrated in FIGS. 1-3, 5-9 and 11-14 may be embodied as various numbers of hardware, software and/or firmware structures that execute respective functions described above, according to an exemplary embodiment. For example, at least one of these retimer, reconfigurable logic chip, operation circuit, controller, processor or other element may use a direct circuit structure, such as a memory, a processor, a logic circuit, a look-up table, etc. that may execute the respective functions through controls of one or more microprocessors or other control apparatuses. Also, at least one of these retimer, reconfigurable logic chip, operation circuit, controller, processor or other element may be specifically embodied by a module, a program, or a part of code, which contains one or more executable instructions for performing specified logic functions, and executed by one or more microprocessors or other control apparatuses. Also, at least one of these retimer, reconfigurable logic chip, operation circuit, controller, processor or other element may further include or may be implemented by a processor such as a central processing unit (CPU) that performs the respective functions, a microprocessor, or the like. Two or more of these retimer, reconfigurable logic chip, operation circuit, controller, processor or other element may be combined into one single component, element, module or unit which performs all operations or functions of the combined two or more retimer, reconfigurable logic chip, operation circuit, controller, processor or other element. Also, at least part of functions of at least one of these retimer, reconfigurable logic chip, operation circuit, controller, processor or other element may be performed by another of these components. Further, although a bus is not illustrated in each of the above block diagrams, communication between the components may be performed through the bus. Functional aspects of the above example embodiments may be implemented in algorithms that execute on one or more processors. Furthermore, the retimer, reconfigurable logic chip, operation circuit, controller, processor or other element represented by a block or processing steps may employ any number of related art techniques for electronics configuration, signal processing and/or control, data processing and the like.

While example embodiments have been described, it will be understood that various changes and modifications may be made therein without departing from the spirit and scope of the following claims.

What is claimed is:

1. A storage device comprising:
a nonvolatile memory;
a controller coupled to the nonvolatile memory;
a first port via which the controller communicates with another device according to a first interface protocol; and
a second port via which the controller communicates with the other device according to a second interface protocol and is different from the first port,
wherein the controller is configured to receive a first command and first data related to the first command from the other device via the first port,
the controller is configured to generate a second command based on the first command, to generate second data based on the first data, and to send the second command and the second data to the other device via the second port,
the controller is configured to receive third data from the other device via the second port, to generate response data regarding the first command based on the third data, and
the controller is configured to send the response data to the other device via the first port.

2. The storage device of claim 1, wherein the first interface protocol is a peripheral component interconnect express (PCIe) protocol.

3. The storage device of claim 1, wherein the second interface protocol is different from the first interface protocol.

4. The storage device of claim 1, wherein when the first command is a write request, the controller writes the third data to the nonvolatile memory, and generates the response data regarding the write request.

5. The storage device of claim 1, further comprising a volatile memory connected to the controller.

6. The storage device of claim 5, wherein the other device accesses the volatile memory via the second port.

7. A first device connected to a third device via a first port and a second port that is different from the first port, the first device comprising:
a retimer configured to receive a first command and first data related to the first command from a second device, to generate a second command based on the first command, to generate second data based on the first data, and to send the second command and the second data to the third device via the first port; and
an operation circuit configured to receive third data from the third device via the second port, to perform an operation on the third data to generate fourth data, and send the fourth data to the third device via the second port,
wherein the retimer is configured to receive response data from the third device via the first port, to adjust the response data, and to send the adjusted response data to the second device,
the third data is related to the second data, and
the response data is related to the first command.

8. The first device of claim 7, further comprising a third port via which the operation circuit communicates with the third device.

9. The first device of claim 7, wherein the operation circuit receives a third command related to the third data from the third device.

10. The first device of claim 7, wherein the first device is a field programmable gate array (FPGA) chip.

11. The first device of claim 7, wherein the retimer is a peripheral component interconnect express (PCIe) retimer according to a PCIe protocol.

12. The first device of claim 7, wherein the third device comprises:
a nonvolatile memory; and
and a controller coupled to the nonvolatile memory.

13. A device comprising:
a reconfigurable logic chip including a retimer and an operation circuit; and
a storage device including a nonvolatile memory, a first port, a second port that is different from the first port, and a controller coupled to the nonvolatile memory,
wherein the controller is configured to communicate with the retimer via the first port, and to communicate with the operation circuit via the second port,
the retimer is configured to receive first data from an external device, to generate second data based on the first data, and to send the second data to the controller via the first port,
the controller is configured to generate third data based on the second data, and to send the third data to the operation circuit via the second port, and
the operation circuit is configured to perform an operation on the third data to generate fourth data, and send the fourth data to the controller via the second port.

14. The device of claim 13, wherein the controller generates response data based on the fourth data and sends the response data to the retimer via the first port, and
the retimer adjusts the response data and sends the adjusted response data to the external device.

15. The device of claim 14, wherein the retimer receives a first command related to the first data from the external device, generates a second command based on the first command, and sends the second command to the controller via the first port.

16. The device of claim 15, wherein when the first command is a write request, the controller writes the fourth data to the nonvolatile memory, and generates the response data regarding the write request.

17. The device of claim 13, wherein the controller communicates with the retimer via the first port according to a first interface protocol, and
the controller communicates with the operation circuit via the second port according to a second interface protocol.

18. The device of claim 17, wherein the first interface protocol is a peripheral component interconnect express (PCIe) protocol.

19. The device of claim 13, wherein the storage device includes a volatile memory coupled to the controller and coupled to the operation circuit via the second port.

20. The device of claim 13, wherein the retimer is a peripheral component interconnect express (PCIe) retimer according to a PCIe protocol.

\* \* \* \* \*